United States Patent
Kim et al.

(10) Patent No.: US 8,785,982 B2
(45) Date of Patent: Jul. 22, 2014

(54) PIXEL FOR DEPTH SENSOR AND IMAGE SENSOR INCLUDING THE PIXEL

(75) Inventors: Woo Joo Kim, Hwaseong-si (KR); Hyoung Soo Ko, Hwaseong-si (KR); Yoon Dong Park, Osan-si (KR); Jung Bin Yun, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/614,082

(22) Filed: Sep. 13, 2012

(65) Prior Publication Data

US 2013/0119438 A1 May 16, 2013

(30) Foreign Application Priority Data

Nov. 15, 2011 (KR) .......................... 10-2011-0118989

(51) Int. Cl.
*H01L 27/148* (2006.01)

(52) U.S. Cl.
USPC .......... 257/225; 257/212; 257/213; 257/223; 257/226; 257/E27.15

(58) Field of Classification Search
USPC ............. 257/225, 212, 213, 223, 226, E27.15
See application file for complete search history.

(56) References Cited

U.S. PATENT DOCUMENTS

2009/0284731 A1* 11/2009 Jin et al. ....................... 356/4.01
2010/0073462 A1*  3/2010 Lee et al. ........................ 348/46

FOREIGN PATENT DOCUMENTS

| JP | 2007124217 A | 5/2007 |
| JP | 2010103667 A | 5/2010 |
| JP | 2010141638 A | 6/2010 |
| JP | 2010187022 A | 8/2010 |

* cited by examiner

*Primary Examiner* — Timor Karimy
(74) *Attorney, Agent, or Firm* — Harness, Dickey & Pierce, P.L.C.

(57) ABSTRACT

A unit pixel of a depth sensor including a light-intensity output circuit configured to output a pixel signal according to a control signal, the pixel signal corresponding to a first electric charge and a second electric charge, a first light-intensity extraction circuit configured to generate the first electric charge and transmit the first electric charge to the light-intensity output circuit, the first electric charge varying according to an amount of light reflected from a target object and a second light-intensity extraction circuit configured to generate the second electric charge and transmit the second electric charge to the light-intensity output circuit, the second electric charge varying according to the amount of reflected light. The light-intensity output circuit includes a first floating diffusion node. Accordingly, it is possible to minimize waste of a space, thereby manufacturing a small-sized pixel.

20 Claims, 14 Drawing Sheets

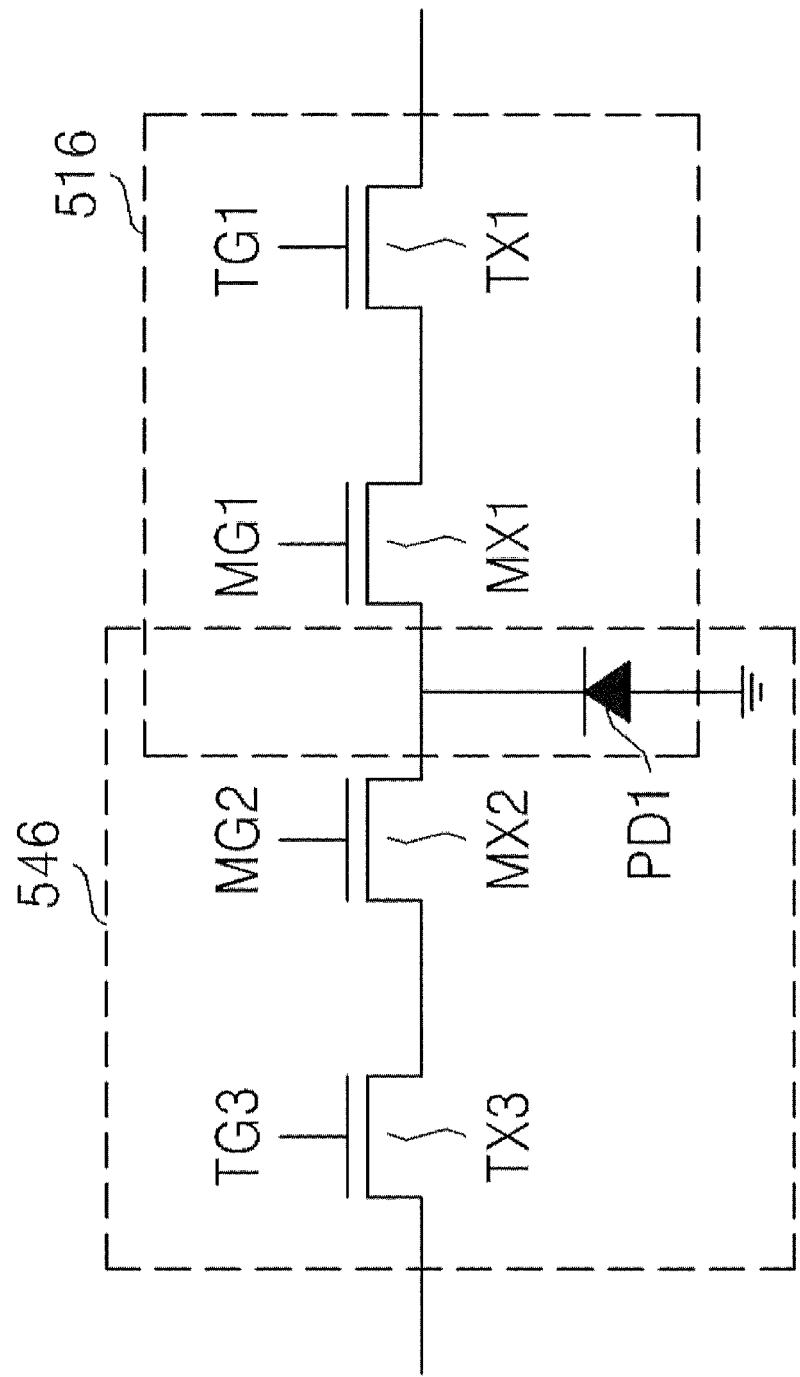

PIXEL FOR DEPTH SENSOR AND IMAGE SENSOR INCLUDING THE PIXEL

CROSS-REFERENCE TO RELATED APPLICATIONS

This application claims the benefit of Korean Patent Application No. 10-2011-0118989, filed on Nov. 15, 2011, in the Korean Intellectual Property Office, the disclosure of which is incorporated herein in its entirety by reference.

BACKGROUND

One or more aspects of the inventive concepts relate to a pixel for a depth sensor.

A depth sensor is a device that measures the distance between the depth sensor and a target object by measuring a delay time incurred for pulse light projected from the light source to be reflected from the target object and then to return back to the depth sensor. A pixel for the depth sensor includes a plurality of photoelectric conversion devices. Each of the photoelectric conversion devices may generate photoelectric charges according to the amount of the pulse light reflected from the light source and returning back to the depth sensor. Using the received photoelectric charges, the distance between the depth sensor and the target object may be measured by calculating the difference between a point of time when the pulse light is projected and a point of time when the pulse light is sensed is referred to as a Time of Flight (ToF). In other words, the depth sensor may calculate the distance between the depth sensor and the target object by using photoelectric charges generated by the plurality of photoelectric conversion devices in response to the received reflected light source. Further, a three-dimensional (3D) image may be formed by using color information obtained from another type of sensor.

Conventionally, each of the pixels included in a depth sensor has an independently constructed floating diffusion node or a drain node. Further, if each pixel has a drain node, then the distance between pixels may increase resulting in both a decrease in a sensitivity of the depth sensor because of a reduction in a number of sensors and a decrease in the speed of transmitting the photoelectric charges within the sensors. Therefore, the distance between the depth sensor and a target object may be incorrectly calculated. Accordingly, the distances between the photoelectric conversion devices should be reduced resulting in a reduction space requirements and improvements in the sensitivity of the depth sensor and the precision of distance calculation.

SUMMARY

According to one aspect of the inventive concept, there is provided a unit pixel for a depth sensor, the unit pixel including a light-intensity output circuit configured to output a pixel signal corresponding to a received first electric charge and a received second electric charge according to control signals; a first light-intensity extraction circuit configured to generate the first electric charge and transmit the first electric charge to the light-intensity output circuit, the first electric charge varying according to an amount of light reflected from a target object; and a second light-intensity extraction circuit configured to generate a second electric and transmit the second electric charge to the light-intensity output circuit, the second electric charge varying according to the amount of the reflected light.

The first light-intensity extraction circuit may include a first transmission transistor including a first end terminal connected to the light-intensity output circuit and configured to transmit the first electric charge to the light-intensity output circuit; a first drain transistor including a first end terminal connected to a second end terminal of the first transmission transistor; and a first photoelectric conversion device including a first end connected to the second end terminal of the first transmission transistor and the first end terminal of the first drain transistor, the first photoelectric conversion device configured to generate the first electric charge such that the first electric charge varies according to the amount of the reflected light.

The first light-intensity extraction circuit may include a first transmission transistor including a first end terminal connected to the light-intensity output circuit; a first modulating block connected to a second end terminal of the first transmission transistor; a first drain transistor including a first end terminal connected to the first modulating block; and a first photoelectric conversion device connected to the first modulating block, the first photoelectric conversion device configured to generate the first electric charge such that the first electric charge varies according to the amount of the reflected light. The first modulating block may include at least one modulating transistor connected in series between the second end terminal of the first transmission transistor and the first end terminal of the first drain transistor. The at least one modulating transistor is configured to transmit the first electric charge to the first transmission transistor and the first drain. The first transmission transistor may transmit the first electric charge to the light-intensity output circuit.

The second light-intensity extraction circuit may include a second transmission transistor including a first end terminal connected to the light-intensity output circuit and configured to transmit the second electric charge to the light-intensity output circuit; a second drain transistor including a first end terminal connected to a second end terminal of the second transmission transistor; and a second photoelectric conversion device including a first end of which is connected to the second end terminal of the second transmission transistor and the first end terminal of the second drain transistor, the second photoelectric conversion device configured to generate the second electric charge such that the second electric charge varies according to the amount of the reflected light.

According to another aspect of the inventive concepts, there is provided a unit pixel for a depth sensor, the unit pixel including a light-intensity output circuit configured to output a pixel signal according to a first electric charge, a second electric charge and control signals; a first light-intensity extraction circuit configured to generate the first electric charge and transmit the first electric charge to the light-intensity output circuit, the first electric charge varying according to an amount of light reflected from a target object; and a second light-intensity extraction circuit configured to generate a second electric charge and transmit the second electric charge to the light-intensity output circuit, the second electric charge varying according to the amount of light reflected. The first photoelectric conversion device may be shared by a third light-intensity extraction circuit, and the second photoelectric conversion device may be shared by a fourth light-intensity extraction circuit.

The unit pixel may be a first pixel. The third light-intensity extraction circuit may be included in a second pixel adjacent to the first pixel. The fourth light-intensity extraction circuit may be included in a third pixel adjacent to the first pixel.

The first light-intensity extraction circuit may further include a first transmission transistor including a first end terminal connected to the light-intensity output circuit and configured to transmit the first electric charge to the light-intensity output circuit. The first photoelectric conversion device may have a first end terminal connected to a second end terminal of the first transmission transistor and a first end terminal of a third transmission transistor included in the third light-intensity extraction circuit.

According to another example embodiment, there is provided a unit pixel array including a depth pixel configured to sense an amount of a light reflected from a target object. The depth pixel including, a first light-intensity extraction circuit, a second light-intensity extraction circuit and a light-intensity output circuit. The first light-intensity extraction circuit including a first photoelectric conversion device configured to generate a first electric charge corresponding to the amount of light reflected, the first light-intensity extraction unit configured to selectively provide the first electric charge to a floating diffusion node. The second light-intensity extraction circuit including a second photoelectric conversion device configured to generate a second electric charge corresponding to the amount of light reflected, the second light-intensity extraction unit configured to selectively provide the second electric charge to the floating diffusion node. The light-intensity output circuit including the floating diffusion node, the light intensity output circuit configured to output a pixel signal that corresponds to the first electric charge and the second electric charge, if the light-intensity output circuit receives a select signal.

BRIEF DESCRIPTION OF THE DRAWINGS

Example embodiments of the inventive concepts will be more clearly understood from the following detailed description taken in conjunction with the accompanying drawings in which:

FIG. 7C is a circuit diagram of another modified example of the first light-intensity extraction circuit included in the pixel for the depth sensor of FIG. 5, according to another example embodiment of the inventive concepts;

DETAILED DESCRIPTION OF THE EMBODIMENTS

Figure 1:
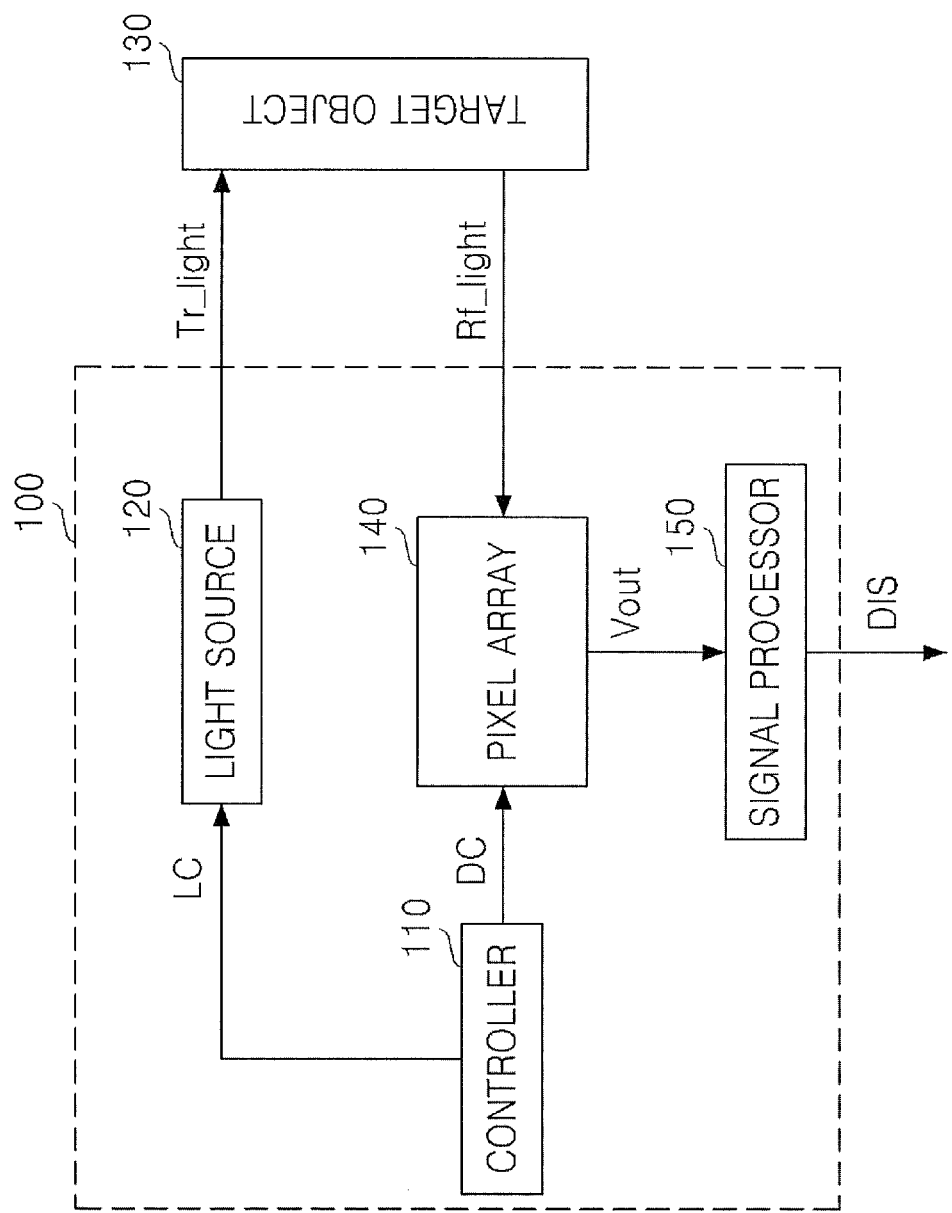
FIG. 1 is a block diagram of a depth sensor with pixels, according to an example embodiment of the inventive concepts.

The inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will FIG. 1 is a block diagram of a depth sensor 100 with pixels, according to an example embodiment of the inventive concepts.

Referring to FIG. 1 the depth sensor 100 may include a controller 110, a light source 120, a pixel array 140, and a signal processor 150.

The controller 110 may control operations of the light source 120 and the pixel array 140. That is, the controller 110 may control operations of the light source 120 and pixels included in the pixel array 140 by generating various types of control signals, such as a light source control signal LC and pixel array control signals DC, TG, DG, MG, SEL, and RS which will be described below.

The light source 120 may project pulse light Tr_light, i.e., light onto a target object 130, the ON/OFF timing of which is controlled according to the light source control signal LC. The pulse light Tr_light is reflected from the target object 130 back to the depth sensor 100. The pulse light Tr_light may be periodically projected onto the target object 130.

The pixel array 140 may include a plurality of photo sensors that receive the transmitted light Tr_light as reflected light Rf_light, which is reflected from the target object 130. Based on the reflected light Rf_light, the pixel array 140 may output an electric charge signal Vout according to a pixel array control signal DC received from the controller 110.

The signal processor 150 may receive the electric charge signal Vout from the pixel array 140, measure the distance between the depth sensor 100 and the target object 130 by calculating a time of flight (ToF) based on the electric charge signal Vout, and then output a result DIS of the measuring.

Accordingly, the depth sensor 100 may measure the distance between the depth sensor 100 and the target object 130 by calculating a time, i.e., the ToF, which is needed for the pulse light Tr_light projected from the light source 120 to be reflected from the target object 100 and to return back to the depth sensor 100.

Figure 2:
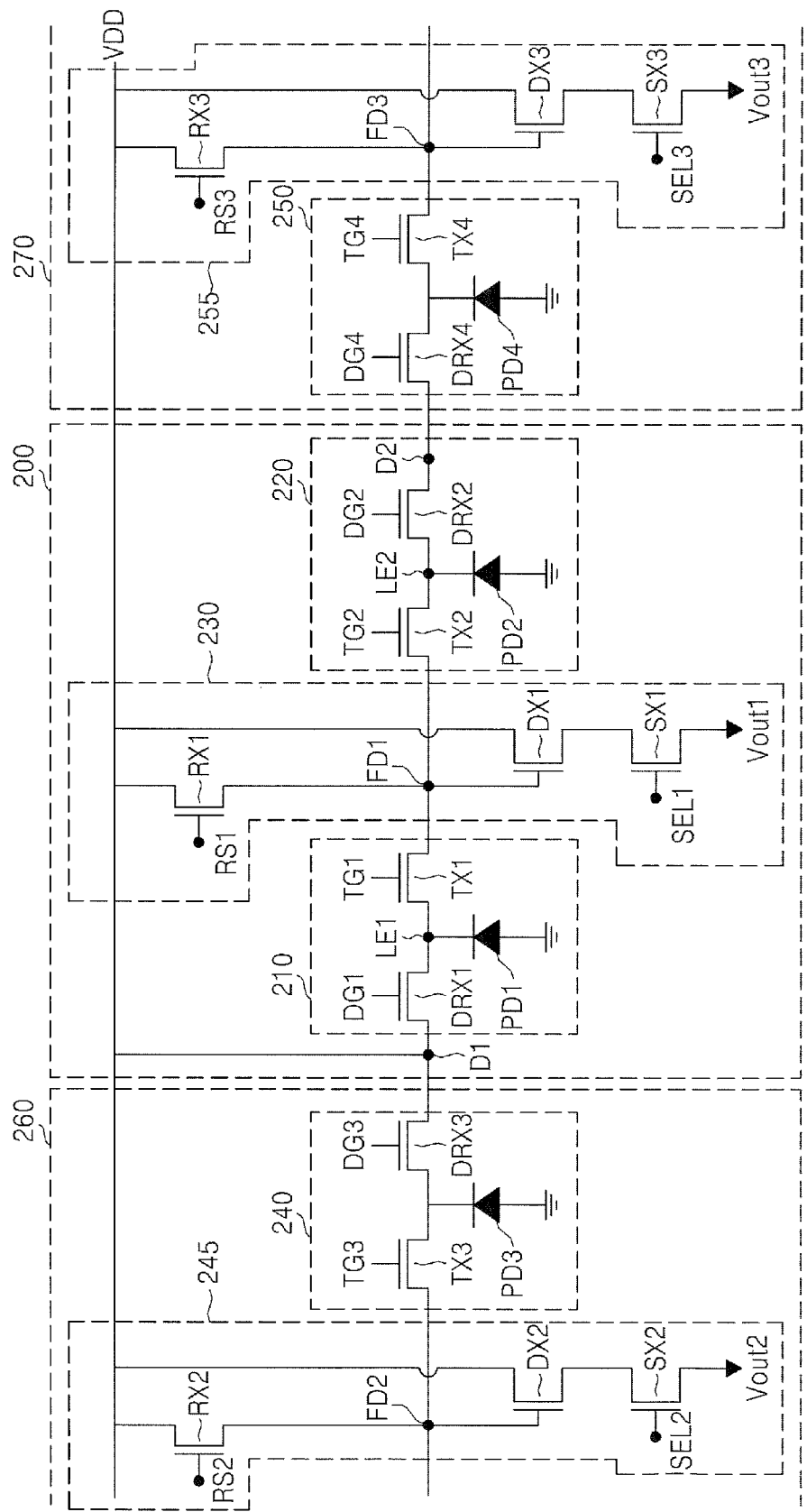
FIG. 2 is a circuit diagram of a pixel for a depth sensor including light-intensity extraction circuits, according to an example embodiment of the inventive concepts.

FIG. 2 is a circuit diagram of a pixel 200 contained in a pixel array of a depth sensor, according to an example embodiment of the inventive concepts.

Referring to FIGS. 1 and 2, the pixel 200 is shown with a partial view of two adjacent pixels, namely a second pixel 260 and a third pixel 270. These adjacent pixels are shown to illustrate nodes that the pixel 200 shares with the adjacent pixels to minimize the size of the depth sensor 100 and simplify its circuit design.

The pixel 200 is a unit pixel included in the pixel array 140, and may include a first light-intensity extraction circuit 210, a second light-intensity extraction circuit 220, and a first light-intensity output circuit 230.

The first light-intensity extraction circuit 210 may include a first photoelectric conversion device PD1, a first transmission transistor TX1, and a first drain transistor DRX1.

The first photoelectric conversion device PD1 may receive light reflected from the target object 130, generate a first electric charge according to the intensity of the reflected light, and transmit the first electric charge to a first photoelectric node LE1. The first photoelectric conversion device PD1 may be a photo sensor, and may be a photo diode, a photo transistor, a pinned photo diode, or a combination of at least two devices selected from among the photo diode, the photo transistor, and the pinned photo diode.

The first transmission transistor TX1 may transmit the first electric charge accumulated in the first photoelectric node LE1 to a first floating diffusion node FD1 of the first light-intensity output circuit 230, according to a first transmission control signal TG1 input to a gate terminal of the first transmission transistor TX1. The first drain transistor DRX1 may transmit the first electric charge accumulated in the first photoelectric node LE1 to a first drain node D1, according to a first drain control signal DG1 input to a gate terminal of the first drain transistor DRX1.

The first light-intensity extraction circuit 210 of pixel 200 may share the first drain node D1 with a third light-intensity extraction circuit 240 included in the second pixel 260 adjacent to the pixel 200. The third light-intensity extraction circuit 240 may include a third photoelectric conversion device PD3, a third transmission transistor TX3 that operates according to a third transmission control signal TG3, and a third drain transistor DRX3 that operates according to a third drain control signal DG3.

The second light-intensity extraction circuit 220 may include a second photoelectric conversion device PD2, a second transmission transistor TX2, and a second drain transistor DRX2.

The second photoelectric conversion device PD2 may receive the light reflected from the target object 130, generate a second electric charge according to the intensity of the reflected light, and transmit the second electric charge to a second photoelectric node LE2. The second photoelectric conversion device PD2 may be a photo sensor, and may be a photo diode, a pinned photo diode, or a combination of at least two devices selected from among the photo diode, the photo transistor, and the pinned photo diode.

The second transmission transistor TX2 may transmit the second electric charge accumulated in the first photoelectric node LE1 to the first floating diffusion node FD1 of the first light-intensity output circuit 230, according to a second transmission control signal TG2 input to a gate terminal of the second transmission transistor TX2. The second drain transistor DRX2 may transmit the second electric charge accumulated in the second photoelectric node LE2 to a second drain node D2, according to a second drain control signal DG2 input to a gate terminal of the second drain transistor DRX2.

The second light-intensity extraction circuit 220 may share the second drain node D2 with a fourth light-intensity extraction circuit 250 included in a third pixel 270 adjacent to the pixel 200. The fourth light-intensity extraction circuit 250 may include a fourth photoelectric conversion device PD4, a fourth transmission transistor TX4 that operates according to a fourth transmission control signalTG4, and a fourth drain transistor DRX4 that operates according to a fourth drain control signal DG4.

The first light-intensity output circuit 230 may include a first reset transistor RX1, a first drive transistor DX1, and a first selection transistor SX1.

Figure 9:
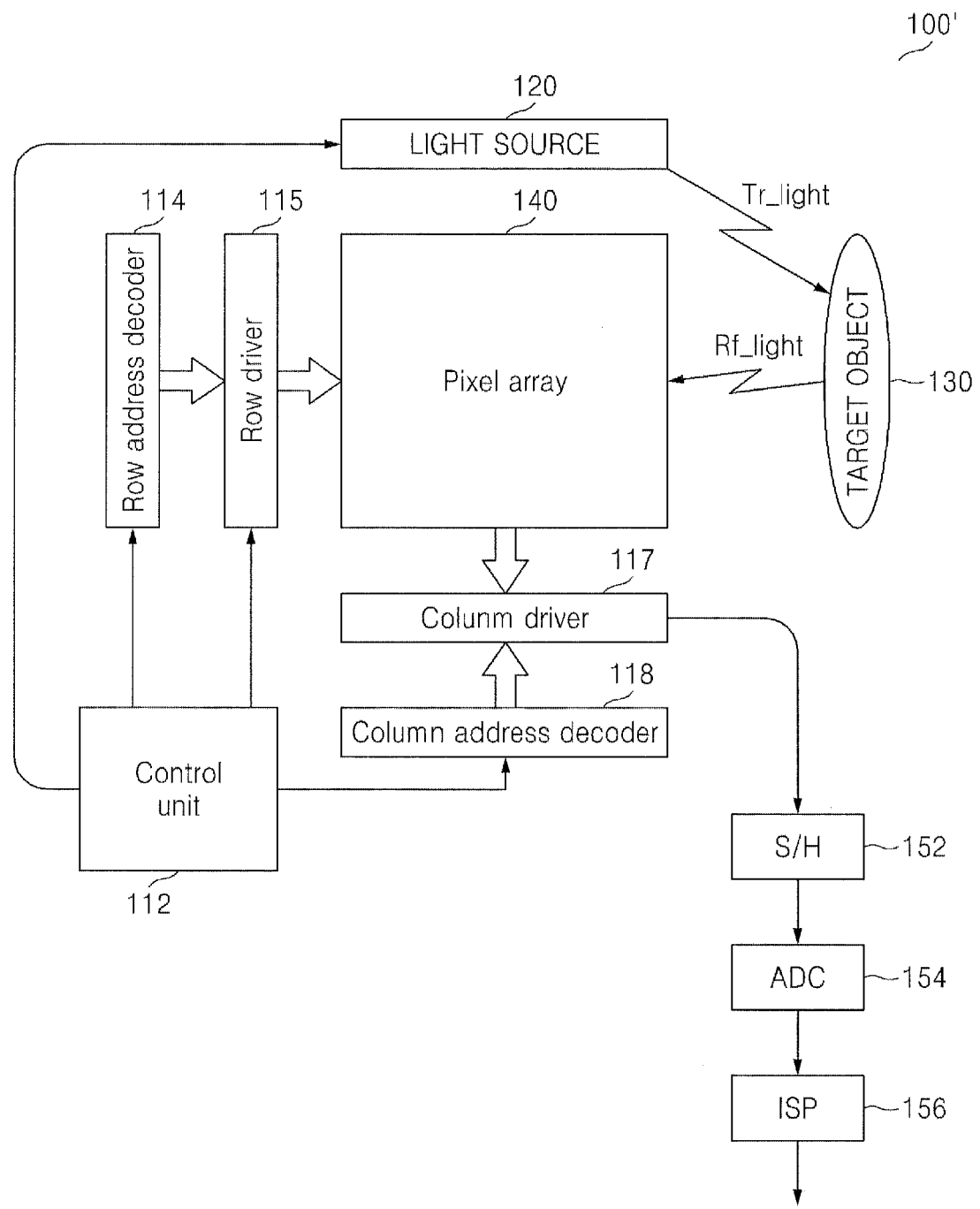
FIG. 9 is a block diagram of an image sensor that includes a pixel for a depth sensor, according to an example embodiment of the inventive concepts.

The first reset transistor RX1 may discharge the first and second electric charges accumulated in the first floating diffusion node FD1, as a reset voltage, i.e., a power supply voltage VDD, according to a first reset signal RS1 received from a row driver 115 illustrated in FIG. 9. The first drive transistor DX1 acts as a source follower buffer amplifier. Since a gate terminal of the first drive transistor DX1 is connected to the first floating diffusion node FD1, the first drive transistor DX1 may generate a first pixel signal by performing buffering according to the first and second electric charges accumulated in the first floating diffusion node FD1.

The first selection transistor SX1 may output the first pixel signal received from the first drive transistor DX1 as an output signal Vout1 to a column line (not shown), according to a first selection signal SEL1 received from the row driver 115 of FIG. 9.

In other words, the first light-intensity output circuit 230 may receive the first or second electric charge from the first or second light-intensity extraction circuit 210 or 220, and then output the first pixel signal, according to control signals including the first reset signal RS1 and the first selection signal SEL1.

The pixel 200 for a depth sensor according to an example embodiment of the inventive concepts is located adjacent to the second pixel 260 and the third pixel 270. Each of the second pixel 260 and the third pixel 270 may have the same structure as that of the pixel 200.

In other words, the second pixel 260 may have the third light-intensity extraction circuit 240, a fifth light-intensity extraction circuit (not shown), and a second light-intensity output circuit 245. The second light-intensity output circuit 245 may share a second floating diffusion node FD2 with the third light-intensity extraction circuit 240 and the fifth light-intensity extraction circuit. The second light-intensity output circuit 245 may include a second reset transistor RX2, a second drive transistor DX2, and a second selection transistor SX2. The second reset transistor RX2 resets the second floating diffusion node FD2 according to a second reset signal RS2. The second drive transistor DX2 generates a second pixel signal by performing buffering according to the amount of electric charges accumulated in the floating diffusion node FD2. The second selection transistor SX2 may output the second pixel signal received from the second drive transistor DX2, as a second output signal Vout2 according to a second selection signal SEL2.

Similarly, the third pixel 270 may include the fourth light-intensity extraction circuit 250, a sixth light-intensity extraction circuit (not shown), and a third light-intensity output circuit 255. The third light-intensity output circuit 255 may share a third floating diffusion node FD3 with the fourth light-intensity extraction circuit 250 and the sixth light-intensity extraction circuit. The third light-intensity output circuit 255 may include a third reset transistor RX3, a third drive transistor DX3, and a third selection transistor SX3. The third reset transistor RX3 resets the third floating diffusion node FD3 according to a third reset signal RS3. The third drive transistor DX3 generates a third pixel signal by performing buffering according to the amount of electric charges accumulated in the third floating diffusion node FD3. The third selection transistor SX3 may output the third pixel signal received from the third drive transistor DX3, as a third output signal Vout3, according to a third selection signal SEL3.

Figure 3:
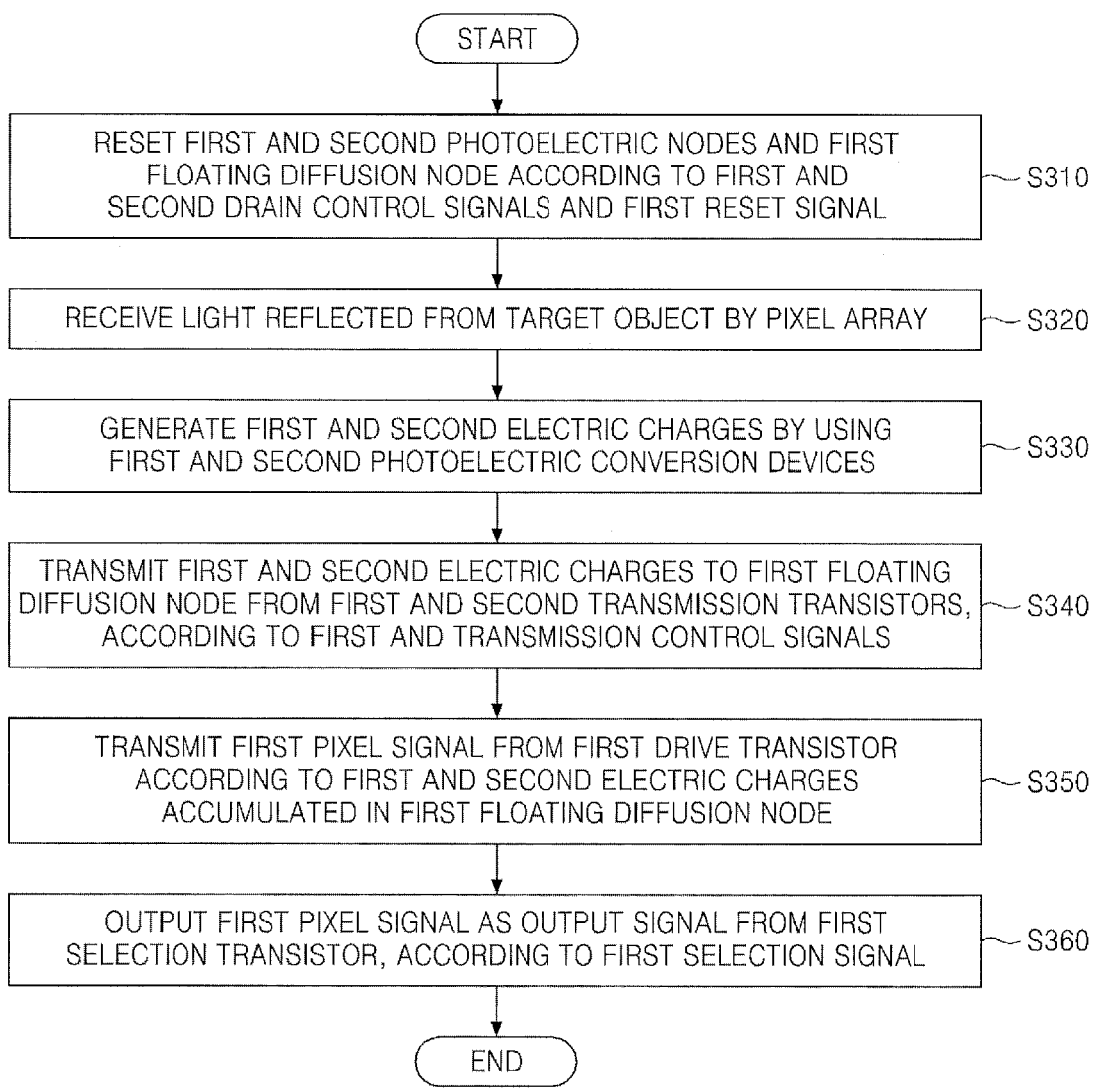
FIG. 3 is a flowchart illustrating an operation of the pixel for the depth sensor illustrated in FIG. 2, according to an example embodiment of the inventive concepts.

FIG. 3 is a flowchart illustrating an operation of the pixel 200 for the depth sensor illustrated in FIG. 2, according to an example embodiment of the inventive concepts.

Referring to FIGS. 1 to 3, in operation S310, the first drain transistor DRX1 may reset the first photoelectric node LE1 by transmitting a first electric charge accumulated in the first photoelectric node LE1 to the first drain node D1, according to a first drain control signal DG1. Similarly, the second drain transistor DRX2 may reset the second photoelectric node LE2 by transmitting a second electric charge accumulated in the second photoelectric node LE2 to the second drain node D2, according to a second drain control signal DG2. The first reset transistor RX1 may reset the first floating diffusion node FD1 by discharging a previous first and second electric charges accumulated in the first floating diffusion node FD1, according to a first reset signal RS1.

Then, in operation S320, light reflected from the target object 130 is incident on the pixel array 140 including the pixel 200. Then, in operation S330, the first and second photoelectric conversion devices PD1 and PD2 included in the pixel 200 may generate a first electric charge and a second electric charge corresponding to the amount of the reflected light, respectively. The first and second electric charges generated by the first and second photoelectric conversion devices PD1 and PD2 may be accumulated in the first photoelectric node LE1 and the second photoelectric node LE2, respectively.

Then, in operation S340, the first transmission transistor TX1 may transmit the first electric charge accumulated in the first photoelectric node LE1 to the first floating diffusion node FD1 according to a first transmission control signal TG1, and the second transmission transistor TX2 may transmit the second electric charge accumulated in the second photoelectric node LE2 to the first floating diffusion node FD1 according to a second transmission control signal TG2. In this case, the transmission of the first electric charge by the first transmission transistor TX1 and the transmission of the second electric charge by the second transmission transistor TX2 may be simultaneously or sequentially performed.

Then, in operation S350, the first drive transistor DX1 having a gate terminal connected to the first floating diffusion node FD1 may generate a first pixel signal when a voltage of the first floating diffusion node FD1 becomes equal to a desired (or, alternatively a predetermined) voltage due to the first and second electric charges transmitted from the first and second light-intensity extraction circuits 210 and 220.

Then, in operation S360, the first selection transistor SX1 may output the first pixel signal received from the first drive transistor DX1, as an output signal Vout according to a selection signal received from the row driver 115 of FIG. 9.

In sum, the pixel 200 for the depth sensor according to an example embodiment of the inventive concepts may include the first light-intensity extraction circuit 210, the second light-intensity extraction circuit 220, and the first light-intensity output circuit 230. The first light-intensity extraction circuit 210 and the second light-intensity extraction circuit 220 may share the first floating diffusion node FD1. Also, the first light-intensity extraction circuit 210 may share the first drain node D1 with the second pixel 260 adjacent to the pixel 200, and the second light-intensity extraction circuit 220 may share the second drain node D2 with the third pixel 270 adjacent to the pixel 200. Accordingly, it is possible to minimize a waste of space, thereby manufacturing a small-sized pixel.

Figure 4A:
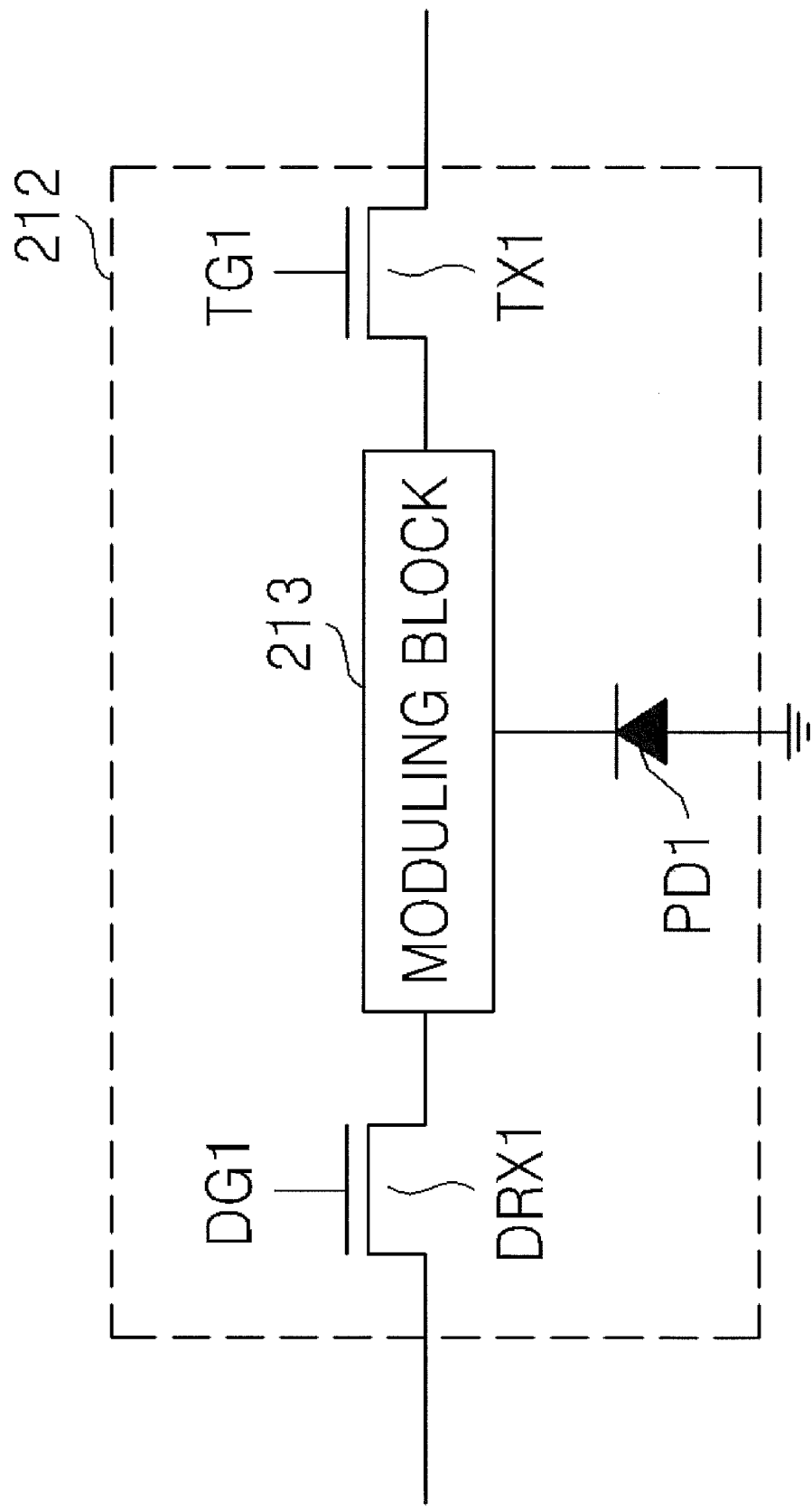
FIG. 4A is a circuit diagram of one modified example of a first light-intensity extraction circuit included in the pixel for the depth sensor of FIG. 2, according to an example embodiment of the inventive concepts.
Figure 4B:
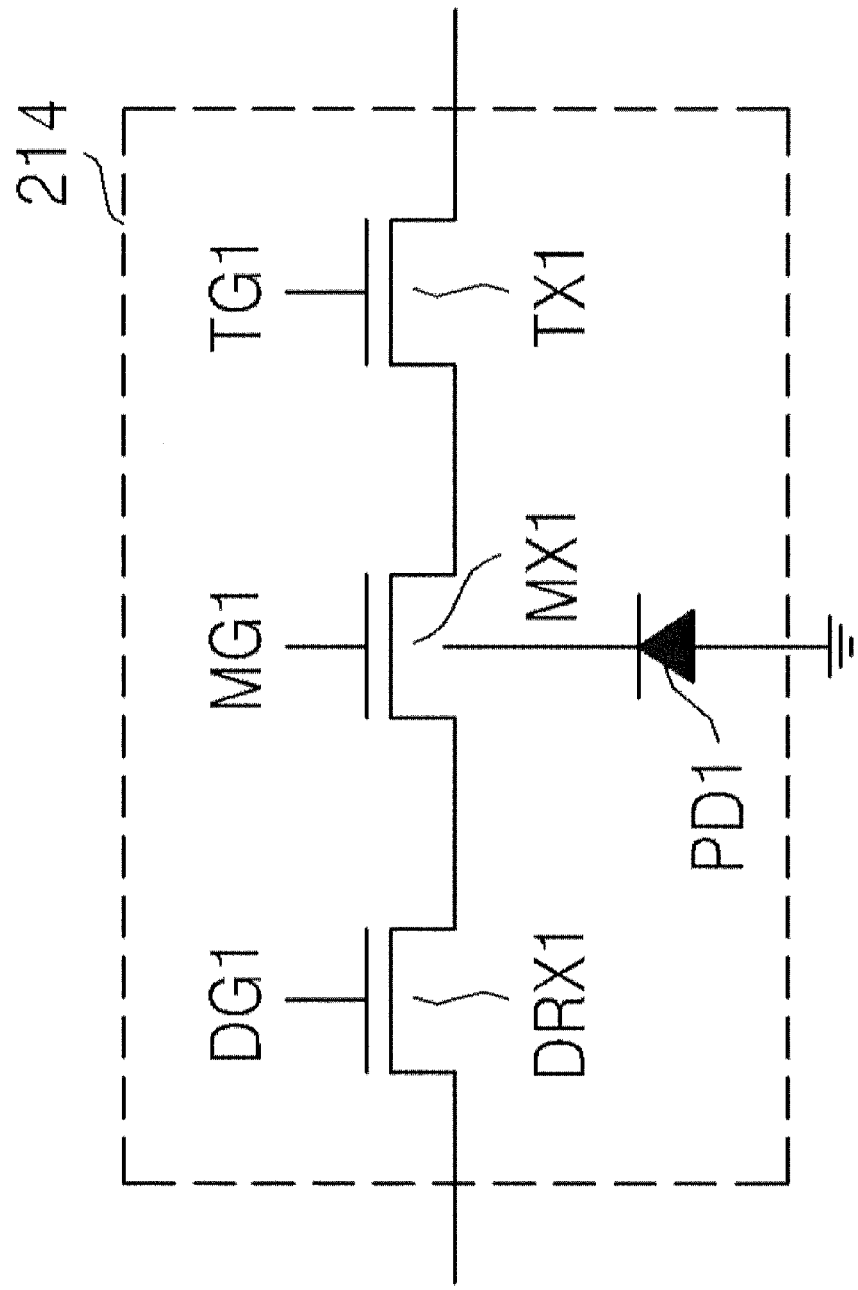
FIG. 4B is a circuit diagram of another modified example of the first light-intensity extraction circuit included in the pixel of the depth sensor of FIG. 2, according to another example embodiment of the inventive concepts.
Figure 4C:
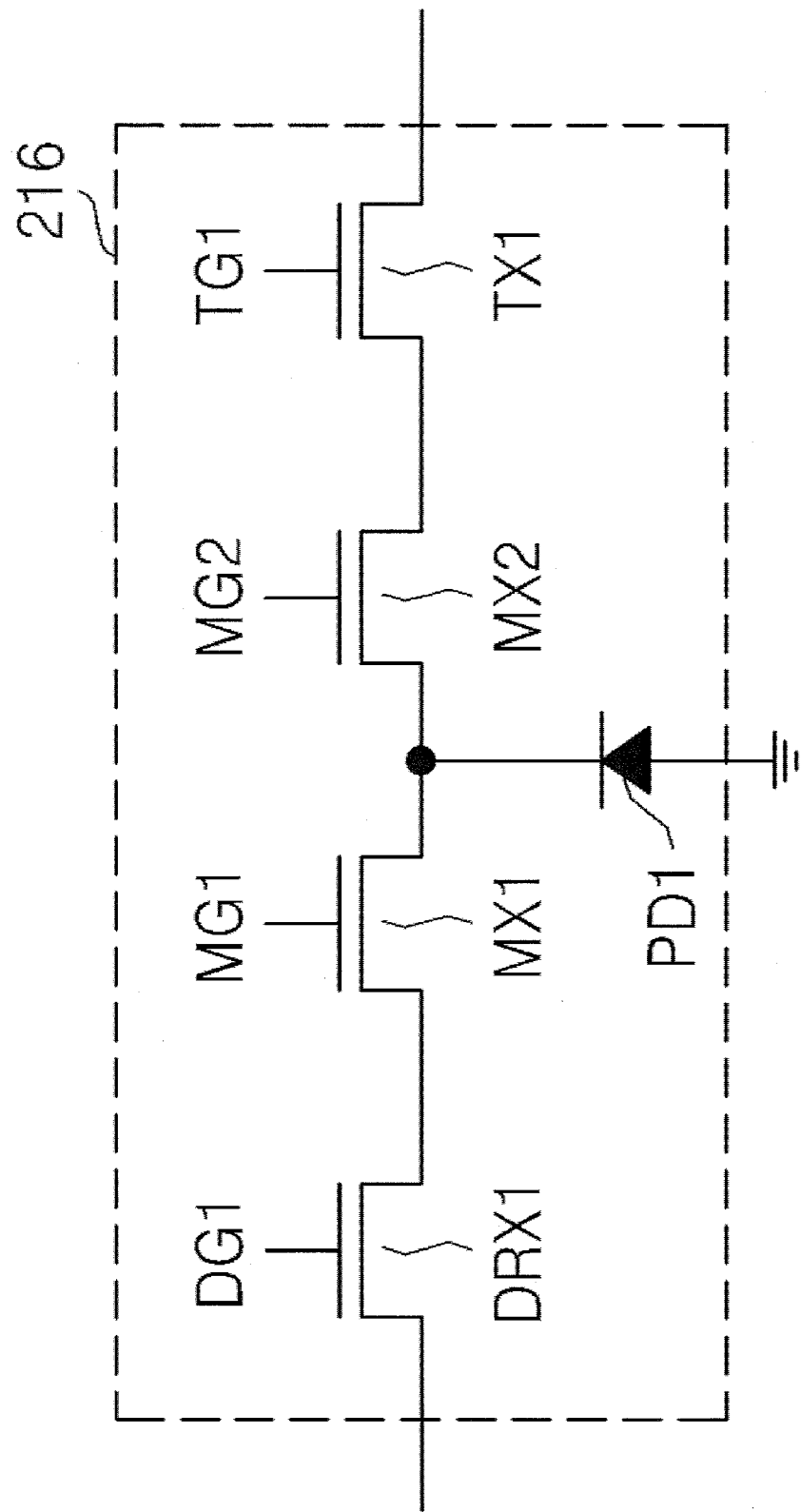
FIG. 4C is a circuit diagram of another modified example of the first light-intensity extraction circuit included in the pixel of the depth sensor of FIG. 2, according to another example embodiment of the inventive concepts.

FIGS. 4A to 4C are circuit diagrams of modified example embodiments of the light-intensity extraction circuit 210 of pixel 200 of FIG. 2 that increase the speed of transmission of the electric charge generated by the photoelectric conversion device PD1.

FIG. 4A is a circuit diagram of a first light-intensity extraction circuit 212 that is one modified example of the first light-intensity extraction circuit 210 included in the pixel 200 for the depth sensor of FIG. 2, according to an example embodiment of the inventive concepts.

Referring to FIGS. 2 and 4A, the first light-intensity extraction circuit 212 may include a first photoelectric conversion device PD1, a first transmission transistor TX1, and a first drain transistor DRX1, and may further include a modulating block 213. The first transmission transistor TX1, the first photoelectric conversion device PD1, and the first drain transistor DRX1 have the same basic operations as those of the first transmission transistor TX1, the first photoelectric conversion device PD1, and the first drain transistor DRX1 illustrated in FIG. 2, and will thus be described focusing on the differences from the first transmission transistor TX1, the first photoelectric conversion device PD1, and the first drain transistor DRX1 illustrated in FIG. 2.

The moduling block 213 may be connected between the first transmission transistor TX1 and the first drain transistor DRX1. One end terminal of the moduling block 213 may be connected to the first photoelectric conversion device PD1. The moduling block 213 may include at least one moduling transistor (not shown). A first electric charge generated by the first photoelectric conversion device PD1 may be transmitted to the first transmission transistor TX1 and the first drain transistor DRX1 via the moduling block 213. When the first electric charge is transmitted via the moduling block 213 located between the first transmission transistor TX1 and the first drain transistor DRX1, according to a moduling control signal, the speed of transmitting the first electric charge between the first photoelectric node LE1 and the first floating diffusion node FD1 may be increased.

The first light-intensity extraction circuit 212 that is one modified example of the first light-intensity extraction circuit 210 has been described above, but modified examples of all light-intensity extraction circuits, e.g., the second light-intensity extraction circuit 220, which are included in the pixel 200 for the depth sensor according to an example embodiment of the inventive concepts may be embodied.

FIG. 4B is a circuit diagram of a first light-intensity extraction circuit 214 that is another modified example of the first light-intensity extraction circuit 210 included in the pixel 200 for the depth sensor, according to another example embodiment of the inventive concepts.

FIG. 4B illustrates a case where the moduling block 213 included in the first light-intensity extraction circuit 210 of FIG. 4A is embodied as one moduling transistor, e.g., a first moduling transistor MX1. A first electric charge generated by a first photoelectric conversion device PD1 may be transmitted to a first transmission transistor TX1 and a first drain transistor DRX1 via the first moduling transistor MX1, according to a first moduling control signalMG1. In this case, when the first moduling transistor MX1 is inserted between the first transmission transistor TX1 and a first drain transistor DRX1, the speed of transmitting the first electric charge between the first photoelectric node LE1 and the first floating diffusion node FD1 of FIG. 2 may be increased.

FIG. 4C is a circuit diagram of a first light-intensity extraction circuit 216 that is another modified example of the first light-intensity extraction circuit 210 included in the pixel 200 of the depth sensor, according to another example embodiment of the inventive concepts.

FIG. 4C illustrates a case where the moduling block 213 included in the first light-intensity extraction circuit 210 of FIG. 4A is embodied as two moduling transistors, e.g., a first moduling transistor MX1 and a second moduling transistor MX2. A first electric charge generated by a first photoelectric conversion device PD1 may be transmitted to a first drain transistor DRX1 via the first moduling transistor MX1 according to a first moduling control signal MG1 or may be transmitted to a first transmission transistor TX1 via the second moduling transistor MX2 according to a second moduling control signal MG2. When the first moduling transistor MX1 and the second moduling transistor MX2 are inserted between the first drain transistor DRX1 and the first transmission transistor TX1, the speed of transmission the first electric charge between the first photoelectric node LE1 and the first floating diffusion node FD1 of FIG. 2 may be increased.

Figure 5:
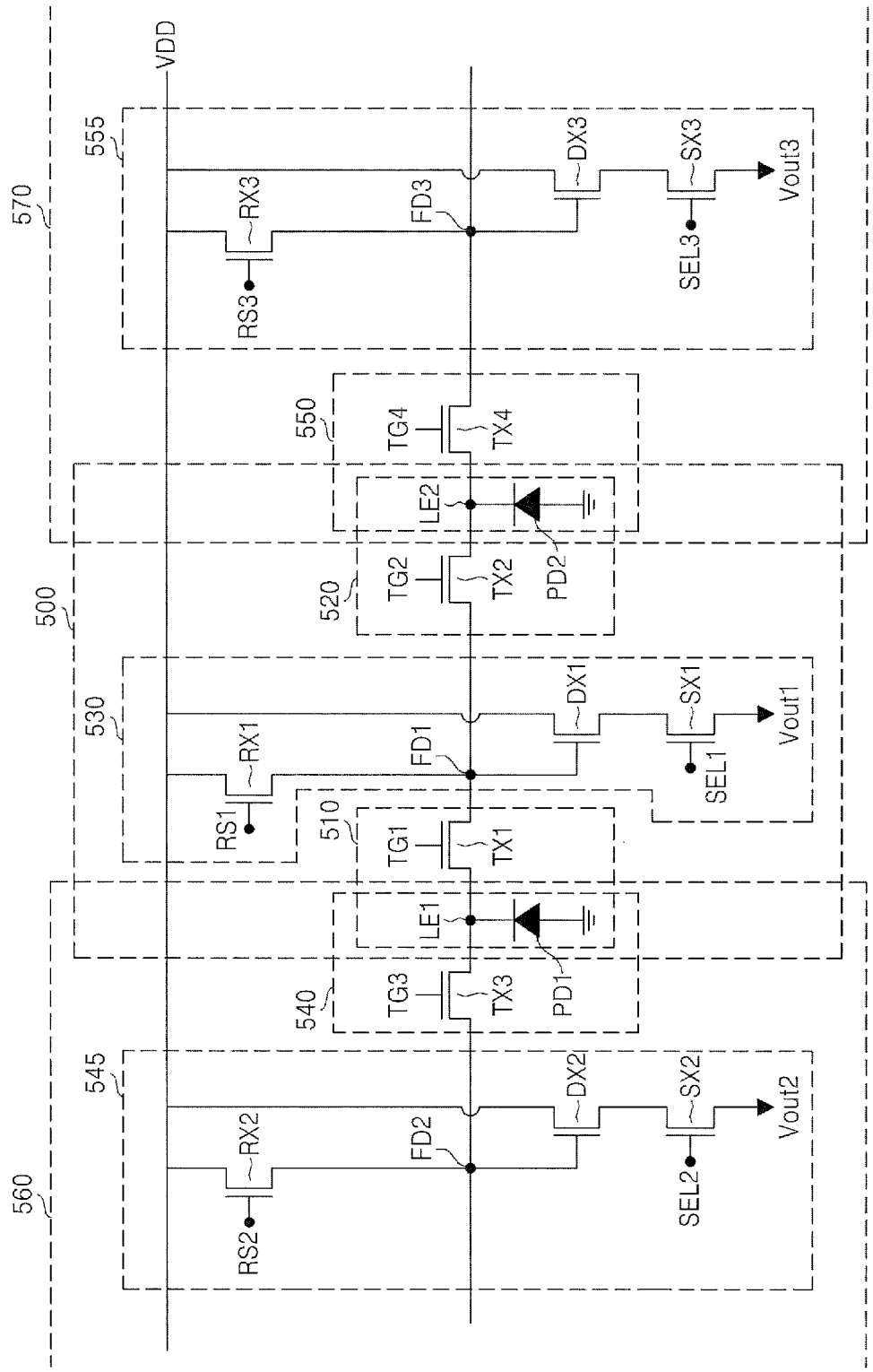
FIG. 5 is a circuit diagram of a pixel for a depth sensor, according to another example embodiment of the inventive concepts.

FIG. 5 is a circuit diagram of a pixel 500 for a depth sensor, according to another example embodiment of the inventive concepts.

Referring to FIGS. 1 and 5, the pixel 500 is a unit pixel included in the pixel array 140, and may include a first light-intensity extraction circuit 510, a second light-intensity extraction circuit 520, and a first light-intensity output circuit 530. The pixel 500 is shown with a partial view of two adjacent pixels, namely a second pixel 560 and a third pixel 570. These adjacent pixels are shown to illustrate photoelectric conversion devices that the pixel 500 shares with the adjacent pixels to minimize the size of the depth sensor 100 and simplify a circuit design of the depth sensor 100.

The first light-intensity extraction circuit 510 may include a first photoelectric conversion device PD1 and a first transmission transistor TX1.

The first photoelectric conversion device PD1 may receive light reflected from the target object 130, generate a first electric charge according to the intensity of the reflected light, and then transmit the first electric charge to a first photoelectric node LE1. The first photoelectric conversion device PD1 may be a photo sensor, and may be a photo diode, a photo transistor, a pinned photo diode, or a combination of at least two devices selected from among the photo diode, the photo transistor, and the pinned photo diode. The first photoelectric conversion device PD1 may be shared by a third light-intensity extraction circuit 540 included in the second pixel 560 adjacent to the pixel 500.

The first transmission transistor TX1 may transmit the first electric charge accumulated in the first photoelectric node LE1 to a first floating diffusion node FD1 of the first light-intensity output circuit 530, according to a first transmission control signal TG1 input to a gate terminal of the first transmission transistor TX1. The first light-intensity extraction circuit 510 may share the first photoelectric conversion device PD1 with the third light-intensity extraction circuit 540 included in the second pixel 560 adjacent to the pixel 500.

The second light-intensity extraction circuit 520 may include a second photoelectric conversion device PD2 and a second transmission transistor TX2.

The second photoelectric conversion device PD2 may receive the light reflected from the target object 130, generate a second electric charge according to the intensity of the reflected light, and then transmit the second electric charge to a second photoelectric node LE2. The second photoelectric conversion device PD2 may be a photo sensor, and may be a photo diode, a photo transistor, a pinned photo diode, or a combination of at least two devices selected from among the photo diode, the photo transistor, and the pinned photo diode. Also, the second photoelectric conversion device PD2 may be shared by a fourth light-intensity extraction circuit 550 included in the third pixel 570 adjacent to the pixel 500.

The second transmission transistor TX2 may transmit the second electric charge accumulated in the second photoelectric node LE2 to the first floating diffusion node FD1 of the first light-intensity output circuit 530, according to a second transmission control signal TG2 input to a gate terminal of the second transmission transistor TX2. The second light-intensity extraction circuit 520 may share the second photoelectric conversion device PD2 with the fourth light-intensity extraction circuit 550 included in the third pixel 570 adjacent to the pixel 500.

The first light-intensity output circuit 530 may include a first reset transistor RX1, a first drive transistor DX1, and a first selection transistor SX1.

The first reset transistor RX1 may discharge the first and second electric charges accumulated in the first floating diffusion node FD1, as a reset voltage, i.e., a power supply voltage VDD, according to a first reset signal RS1 received from the row driver 115 of FIG. 9. The first drive transistor DX1 may act as a source follower buffer amplifier. Since a gate terminal of the first drive transistor DX1 is connected to the first floating diffusion node FD1, the first drive transistor DX1 may generate a first pixel signal by performing buffering according to the accumulated first and second electric charges.

The first selection transistor SX1 may output the first pixel signal received from the first drive transistor DX1 as an output signal to a column line (not shown), according to a first selection signal SEL1 received from the row driver 115 of FIG. 9.

In other words, the first light-intensity output circuit 530 may receive the first or second electric charge from the first or second light-intensity extraction circuit 510 or 520, and may output the first pixel signal according to a control signal including the first reset signal RS1 and the first selection signal SEL1.

The pixel 500 for the depth sensor according to another example embodiment of the inventive concepts is located adjacent to the second pixel 560 and the third pixel 570. Each of the second pixel 560 and the third pixel 570 may have the same structure as that of the pixel 200 for the depth sensor of FIG. 2.

In other words, the second pixel 560 may include the third light-intensity extraction circuit 540, a fifth light-intensity extraction circuit (not shown), and a second light-intensity output circuit 545.

The third light-intensity extraction circuit 540 may include a first photoelectric conversion device PD1 and a third transmission transistor TX3. The first photoelectric conversion device PD1 receives the light reflected from the target object 130, generates a first electric charge according to the intensity of the reflected light, and then transmits the first electric charge to the first photoelectric node LE1. The third transmission transistor TX3 may transmit the first electric charge accumulated in the first photoelectric node LE1 to the second floating diffusion node FD2, according to a third transmission control signal TG3. Thus, the first photoelectric conversion device PD1 may be shared by the first light-intensity extraction circuit 510 and the third light-intensity extraction circuit 540.

The second light-intensity output circuit 545 may share the second floating diffusion node FD2 with the third light-intensity extraction circuit 540 and the fifth light-intensity extraction circuit. The second light-intensity output circuit 545 may include a second reset transistor RX2, a second drive transistor DX2, and a second selection transistor SX2. The second reset transistor RX2 resets the second floating diffusion node FD2 according to a second reset signal RS2. The second drive transistor DX2 generates a second pixel signal by performing buffering according to the amount of electric charges accumulated in the second floating diffusion node FD2. The second selection transistor SX2 outputs the second pixel signal received from the second drive transistor DX2 as a second output signal Vout2, according to a second selection signal SEL2.

Similarly, the third pixel 570 may include the fourth light-intensity extraction circuit 550, a sixth light-intensity extraction circuit (not shown), and a third light-intensity output circuit 555.

The third light-intensity extraction circuit 540 may include a second photoelectric conversion device PD2 and a fourth transmission transistor TX4. The second photoelectric conversion device PD2 may receive the light reflected from the target object 130, generate a first electric charge according to the intensity of the reflected light, and then transmits the first electric charge to the second photoelectric node LE1. The fourth transmission transistor TX4 transmits the second electric charge accumulated in the second photoelectric node LE2 to a third floating diffusion node FD3, according to a fourth transmission control signal TG4. Thus, the second photoelectric conversion device PD2 may be shared by the second light-intensity extraction circuit 520 and the fourth light-intensity extraction circuit 550.

The third light-intensity output circuit 555 may share the third floating diffusion node FD3 by the fourth light-intensity extraction circuit 550 and the sixth light-intensity extraction circuit. The third light-intensity output circuit 555 may include a third reset transistor RX3, a third drive transistor DX3 and a third selection transistor SX3. The third reset transistor RX3 resets the third floating diffusion node FD3 according to a third reset signal RS3. The third drive transistor DX3 generates a third pixel signal by performing buffering according to the amount of electric charges accumulated in the third floating diffusion node FD3. The third selection transistor SX3 may output the third pixel signal received from the third drive transistor DX3, as a third output signal Vout3 according to a third selection signal SEL3.

Figure 6:
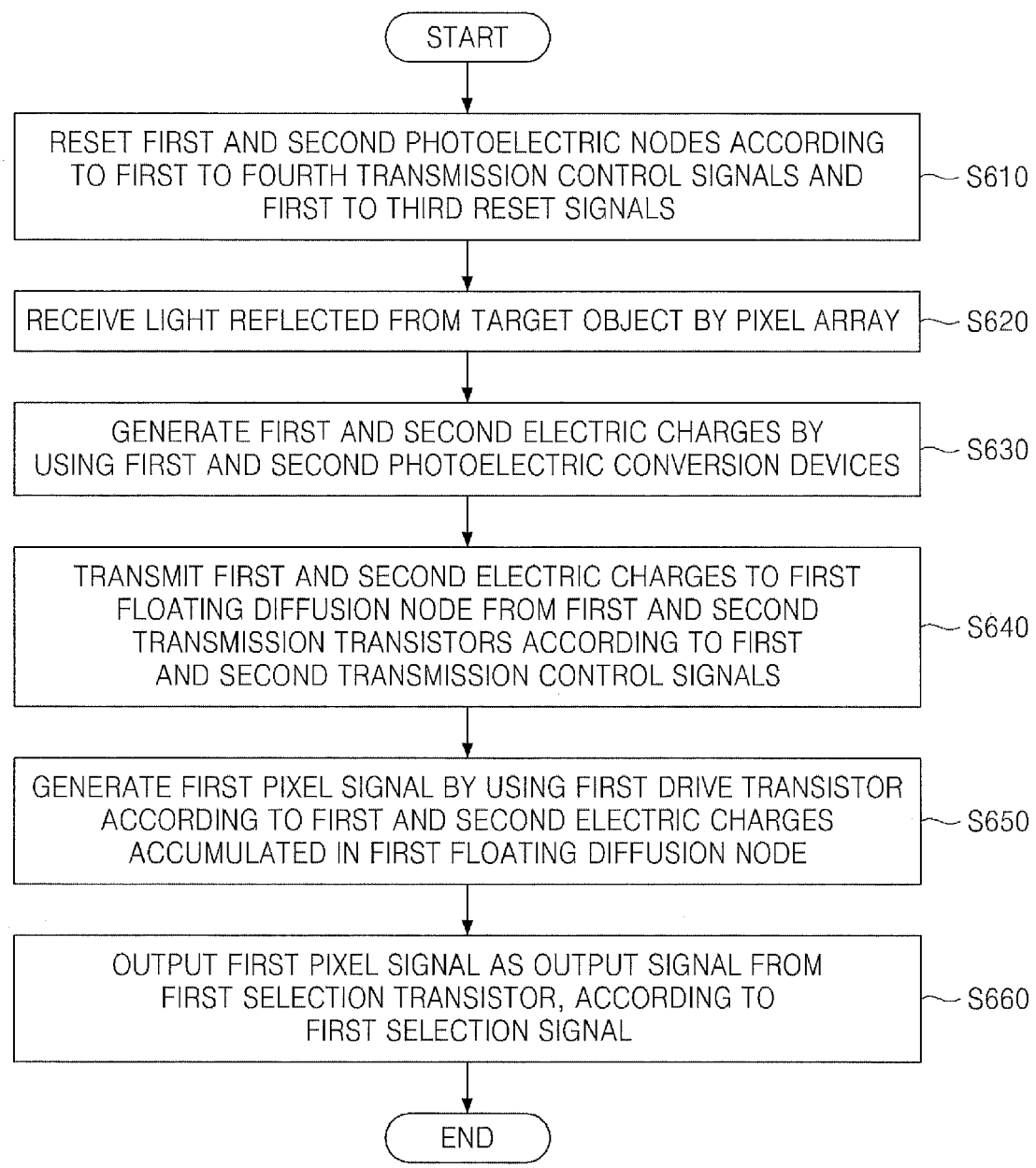
FIG. 6 is a flowchart illustrating an operation of the pixel for the depth sensor illustrated in FIG. 5, according to another example embodiment of the inventive concepts.

FIG. 6 is a flowchart illustrating an operation of the pixel 500 for the depth sensor illustrated in FIG. 5, according to another example embodiment of the inventive concepts.

Referring to FIGS. 1, 5, and 6, in operation S610, the third transmission transistor TX3 may transmit a first electric charge accumulated in the first photoelectric node LE1 to the second floating diffusion node FD2, according to a third transmission control signal TG3, and the second reset transistor RX2 may discharge the first electric charge to reset the first photoelectric node LE1, according to a second reset signal RS2. Also, the first transmission transistor TX1 may transmit the first electric charge accumulated in the first photoelectric node LE1 to the first floating diffusion node FD1 according to a first transmission control signal TG1, and the first reset transistor RX1 may discharge the first electric charge to reset the first photoelectric node LE1 according to a first reset signal RS1. Similarly, the second photoelectric node LE2 of the second light-intensity extraction circuit 520 may be reset according to operations of the third transmission transistor TX3, the fourth transmission transistor TX4, the first reset transistor RX1, and the third reset transistor RX3.

Then, in operation S620, light reflected from the target object 130 is incident on the pixel array 140. Then, in operation S630, the first and second photoelectric conversion devices PD1 and PD2 included in the pixel 500 for the depth sensor may generate a first electric charge and a second electric charge according to the amount of the reflected light, respectively. The first electric charge generated by the first photoelectric conversion device PD1 and the second electric charge generated by the second photoelectric conversion device PD2 may be accumulated in the first photoelectric node LE1 and the second photoelectric node LE2, respectively.

Then, in operation S640, the second transmission transistor TX2 may transmit the first electric charge accumulated in the first photoelectric node LE1 to the first floating diffusion node FD1, according to a second transmission control signal TG2, and the third transmission transistor TX3 may transmit the second electric charge accumulated in the second photoelectric node LE2 to the first floating diffusion node FD1, according to a third transmission control signal TG3. The transmission of the first electric charge by the first transmission transistor TX1 and the transmission of the second electric charge by the second transmission transistor TX2 may be simultaneously or sequentially performed.

Then, in operation S650, the first drive transistor DX1 having a gate terminal connected to the first floating diffusion node FD1 may generate a first pixel signal when a voltage of the first floating diffusion node FD1 becomes equal to a predetermined voltage due to the first and second electric charges transmitted from the first and second light-intensity extraction circuits 510 and 520.

Then, in operation S660, the first selection transistor SX1 may output the first pixel signal received from the first drive transistor DX1 as an output signal, according to a first selection signal SEL1 received from the row driver 115 of FIG. 9.

The pixel 500 for the depth sensor according to another example embodiment of the inventive concepts may include the first light-intensity extraction circuit 510, the second light-intensity extraction circuit 520, and the first light-intensity output circuit 530. The first light-intensity extraction circuit 510 and the second light-intensity extraction circuit 520 may share the first floating diffusion node FD1. The first light-intensity extraction circuit 510 may also share the first photoelectric conversion device PD1 with the third light-intensity extraction circuit 540 included in the second pixel 560 adjacent to the pixel 500. The second light-intensity extraction circuit 520 may share the second photoelectric conversion device PD2 with the fourth light-intensity extraction circuit 550 included in the third pixel 570 adjacent to the pixel 500. Accordingly, it is possible to minimize a waste of space, thereby manufacturing a small-sized pixel.

Figure 7A:
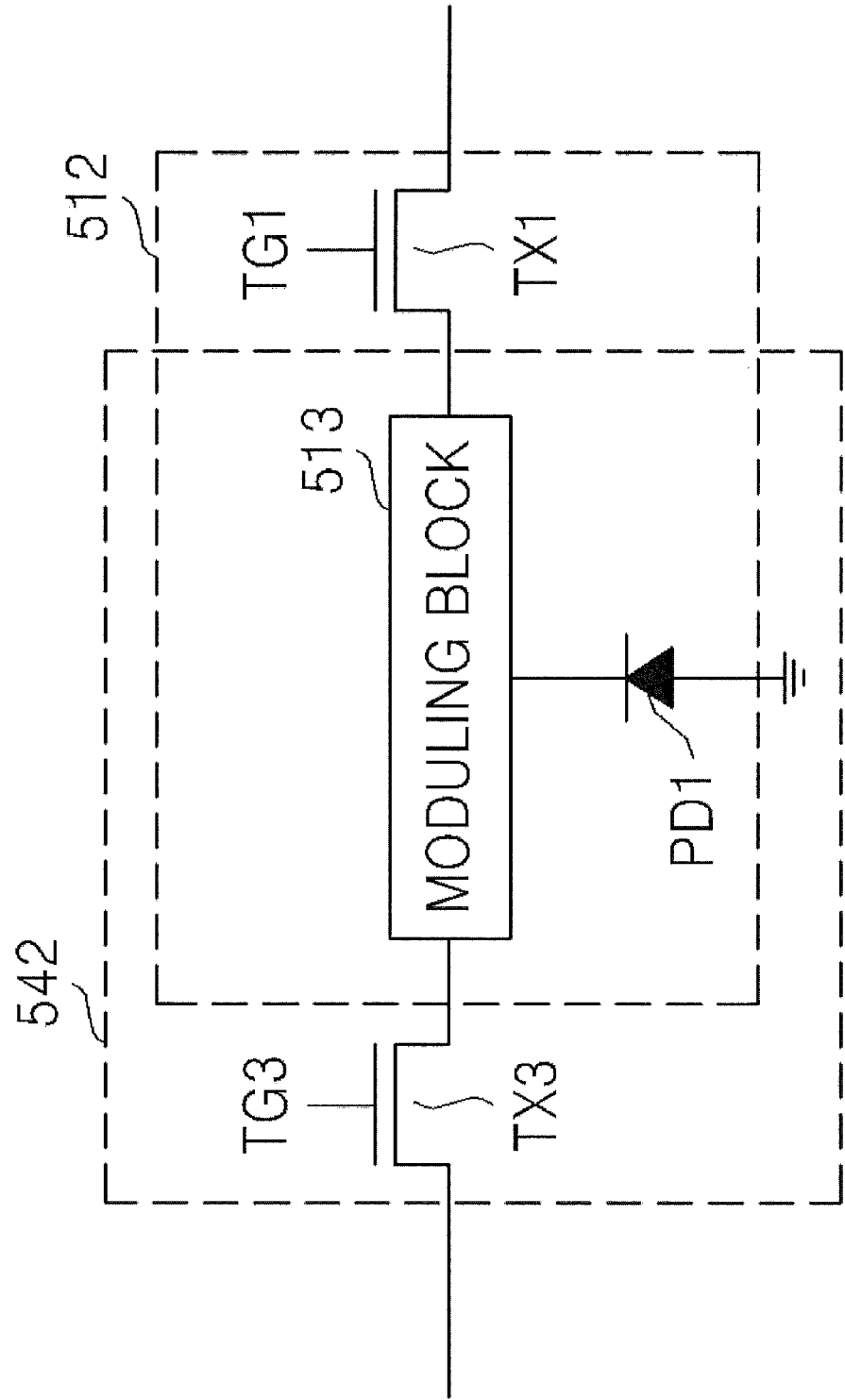
FIG. 7A is a circuit diagram of one modified example of a first light-intensity extraction circuit included in the pixel for the depth sensor of FIG. 5, according to another example embodiment of the inventive concepts.
Figure 7B:
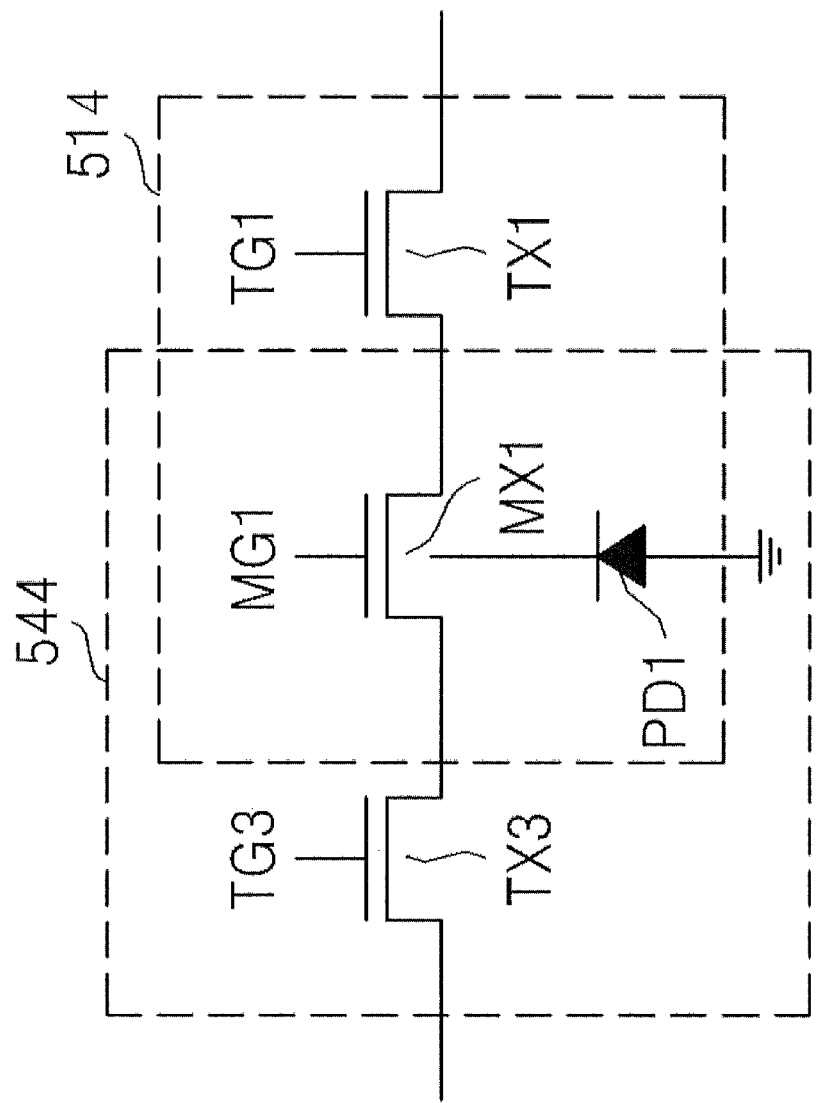
FIG. 7B is a circuit diagram of another modified example of the first light-intensity extraction circuit included in the pixel for the depth sensor of FIG. 5, according to another example embodiment of the inventive concepts.

FIGS. 7A to 7C are circuit diagrams of modified example embodiments of the light-intensity extraction circuits 510 and 540 of pixel 500 of FIG. 5 that increase the speed of transmission of the electric charge generated by the photoelectric conversion device PD1.

FIG. 7A is a circuit diagram of a first light-intensity extraction circuit 512 that is one modified example of the first light-intensity extraction circuit 510 included in the pixel 500 for the depth sensor of FIG. 5, according to another example embodiments of the inventive concepts.

Referring to FIGS. 5 and 7A, the first light-intensity extraction circuit 512 may include a first photoelectric conversion device PD1 and a first transmission transistor TX1, and may further include a modulating block 513. The modulating block 513 and the first photoelectric conversion device PD1 may be shared by the first light-intensity extraction circuit 512 and a third light-intensity extraction circuit 542. The first photoelectric conversion device PD1 and the first transmission transistor TX1 have the same basic operations as those of the first photoelectric conversion device PD1 and the first transmission transistor TX1 of FIG. 5, and will thus now be described focusing on the differences from the first photoelectric conversion device PD1 and the first transmission transistor TX1 of FIG. 5.

The modulating block 513 may be connected between the first transmission transistor TX1 and a third transmission transistor TX3, and one end of the modulating block 513 may be connected to the first photoelectric conversion device PD1. The modulating block 513 may include at least one modulating transistor (not shown). A first electric charge generated by the first photoelectric conversion device PD1 may be transmitted to the first transmission transistor TX1 and the third transmission transistor TX3 via the modulating block 513. When the modulating block 513 is inserted between the first and third transmission transistors TX1 and TX3 and the first electric charge is transmitted via the modulating block 513 according to a modulating control signal, the speed of transmitting the first electric charge between the first photoelectric node LE1 and the first floating diffusion node FD1 of FIG. 5 may be increased.

The first light-intensity extraction circuit 512 that is a modified example of the first light-intensity extraction circuit 510 has been described above, but modified examples of all light-intensity extraction circuits, e.g., the second light-intensity extraction circuit 520, which are included in the pixel 500 for the depth sensor according to another example embodiments of the inventive concepts may be embodied.

FIG. 7B is a circuit diagram of a first light-intensity extraction circuit 514 that is another modified example of the first light-intensity extraction circuit 510 included in the pixel 5100 for the depth sensor of FIG. 5, according to another example embodiments of the inventive concepts.

FIG. 7B illustrates a case where the modulating block 513 included in the first light-intensity extraction circuit 510 illustrated in FIG. 7A is embodied as one modulating transistor, e.g., a first modulating transistor MX1. A first electric charge generated by a first photoelectric conversion device PD1 may be transmitted to the first transmission transistor TX1 and a third transmission transistor TX3 included in a third light-intensity extraction circuit 544 according to a modified example of the inventive concept, via the first modulating transistor MX1, according to a first modulating control signal MG1. In this case, when the first modulating transistor MX1 is inserted between the first and third transmission transistors TX1 and TX3, the speed of transmitting the first electric charge between the first photoelectric node LE1 and the first floating diffusion node FD1 of FIG. 5 may be increased.

FIG. 7C is a circuit diagram of a first light-intensity extraction circuit 516 that is another modified example of the first light-intensity extraction circuit 510 included in the pixel 5100 for the depth sensor of FIG. 5, according to another example embodiments of the inventive concepts.

FIG. 7C illustrates a case where the modulating block 513 included in the first light-intensity extraction circuit 510 illustrated in FIG. 7A is embodied as two modulating transistors, e.g., a first modulating transistor MX1 and a second modulating transistor MX2. A first electric charge generated by a first photoelectric conversion device PD1 may be transmitted to a first transmission transistor TX1 via the first modulating transistor MX1 according to a first modulating control signal MG1 or may be transmitted to a third transmission transistor TX3 included in a third light-intensity extraction circuit 546 according to a modified example of the inventive concepts via the second modulating transistor MX2 according to a second modulating control signal MG2. The first modulating transistor MX1 may be included in the first light-intensity extraction circuit 516, and the second modulating transistor MX2 may be included in the third light-intensity extraction circuit 546. In this case, when the first modulating transistor MX1 and the second modulating transistor MX2 are inserted between the first and third transmission transistors TX1 and TX3, the speed of transmitting the first electric charge between the first photoelectric node LE1 and the first floating diffusion node FD1 of FIG. 5 may be increased.

Figure 8:
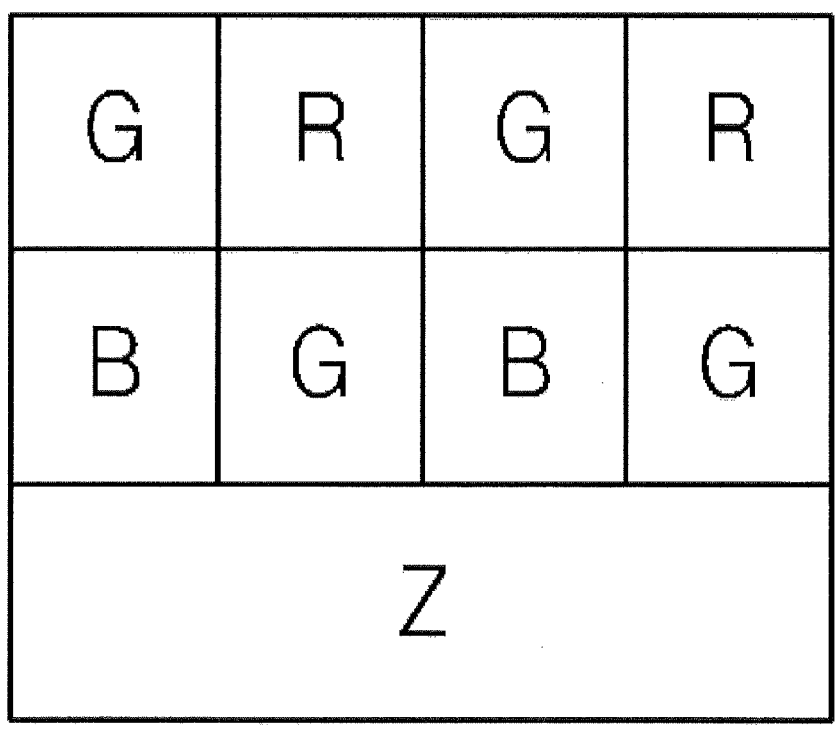
FIG. 8 is a schematic block diagram of a unit pixel array that includes a pixel for a depth sensor, according to an example embodiment of the inventive concepts.

FIG. 8 is a schematic block diagram of a unit pixel array 140' that includes a pixel for a depth sensor, according to an example embodiment of the inventive concepts that may be included in the pixel array 140 illustrated in FIGS. 1 and 9.

Referring to FIG. 8, the unit pixel array 140' may include color pixels, e.g., red (R), green (G), and blue (B) pixels, which sense the color of the target object 130 of FIG. 1, and the depth pixel Z which senses the distance between the unit pixel array 140' and the target object 130. The R, G, and B pixels are components of the unit pixel array 140' having a general Bayer pattern. The depth pixel Z is an additional component of the unit pixel array 140'.

The pixel array 140 of FIG. 1 that includes the unit pixel array 140' according to an example embodiment of the inventive concepts may be a square type pixel array, the ratio between the width and height of which is 1:1. Otherwise, the pixel array 140 that includes the unit pixel array 140' may be a non-square type pixel array, the ratio between the width and height of which is 1:X so as to increase the speed and efficiency of transmitting electric charges and improve a fill-factor (the ratio between a photo sensing region and a unit pixel region).

Although not shown, the inventive concepts are not limited to the pixel array 140 that includes the unit pixel array 140' with the R, G, and B pixels, and the pixel array 140 may include the unit pixel array 140' with a magenta (Mg) pixel and a cyan (Cy) pixel, which are complementary colors, a yellow (Y) pixel, a black (B) pixel, and a white (W) pixel are mixed in a 2×2, 3×3, or 4×4 mosaic or stripe pattern.

FIG. 9 is a block diagram of an image sensor 100' that includes a pixel for a depth sensor, according to an example embodiment of the inventive concepts.

The image sensor 100' is a device that includes the pixel 200 or 500 for a depth sensor illustrated in FIG. 2 or 5 according to an example embodiment of the inventive concepts and is used to obtain a three-dimensional (3D) image signal.

The image sensor 100' may include a light source 120, a pixel array 140, a row address decoder 114, a row driver 115, a column driver 117, a column address decoder 118, a sample/hold (S/H) block 152, an analog-to-digital converter (ADC) 154, and an image signal processor (ISP) 156.

In the pixel array 140, a plurality of unit pixel arrays 140' illustrated in FIG. 8 may be arranged. A plurality of pixels that constitute the pixel array 140 may output pixel signals, e.g., color image signals and distance signals, in units of columns, according to a plurality of control signals generated by the row driver 115.

The controller 112 may output a plurality of control signals for controlling operations of the light source 120, the pixel array 140, the row address decoder 114, the row driver 115, the column driver 117, the column address decoder 118, the S/H block 152, the ADC 154, and the ISP 156, and may generate addressing signals for outputting signals, e.g., color image signals and depth signals, which are sensed by the pixel array 140.

More specifically, the controller 112 may control the row address decoder 114 and the row driver 115 to select a row line connected to a pixel from among the plurality of pixels of the pixel array 140 so that a signal sensed by the pixel may be output.

Also, the controller 112 may control the column driver 117 and the column address decoder 118 to select a column line connected to a pixel from among the plurality of pixels of the pixel array 140.

Similar to the controller 110 illustrated in FIG. 1, the controller 112 may control the light source 120 to periodically project light, and control an ON/OFF timing of photo sensors, e.g., the first and second photoelectric conversion devices PD1 and PD2 of FIG. 2 or 5, which are included in a pixel from among the plurality of pixels of the pixel array 140 to perform distance sensing.

The row address decoder 114 decodes a row control signal received from the controller 112 and outputs the decoded row control signal. The row driver 115 selectively activates a row line of the pixel array 140 according to the decoded row control signal received from the row address decoder 114.

The column address decoder 118 decodes a column control signal, e.g., an address signal, which is received from the controller 112, and outputs the decoded column control signal. The column driver 117 selectively activates a column line of the pixel array 140 according to the decoded column control signal received from the column address decoder 118.

The S/H block 152 may sample and hold a pixel signal output from a pixel selected by the row driver 115 and the column driver 117. For example, the S/H block 152 may sample and hold signals output from a pixel selected by the row driver 115 and the column driver 117 from among the plurality of pixels of the pixel array 140.

The ADC 154 may perform analog-to-digital conversion on signals output from the S/H block 152 and then output analog-to-digital converted pixel data. The S/H block 152 and the ADC 154 may be embodied as one chip together.

The ADC 154 may include a correlated double sampling (CDS) circuit (not shown) that performs CDS on signals received from the S/H block 152. The ADC 154 may compare a signal on which CDS is performed and a ramp signal (not shown), and then output a result of the comparing as analog-to-digital converted pixel data.

The ISP 156 may perform digital image processing, based on the pixel data received from the ADC 154. Similar to the signal processor 150 of FIG. 1, the ISP 156 may receive a signal generated by a pixel for a depth sensor according to an example embodiment of the inventive concepts, and may calculate the distance between the image sensor 100' and the target object 130 by sensing a time of flight (ToF), based on the signal. Also, the ISP 156 may interpolate a Bayer signal having an R, G, B, and Z (depth) format and generate a 3D image signal by using the interpolated Bayer signal. The ISP 156 may further perform edge enhancement and a function of preventing occurrence of pseudo color components.

Figure 10:
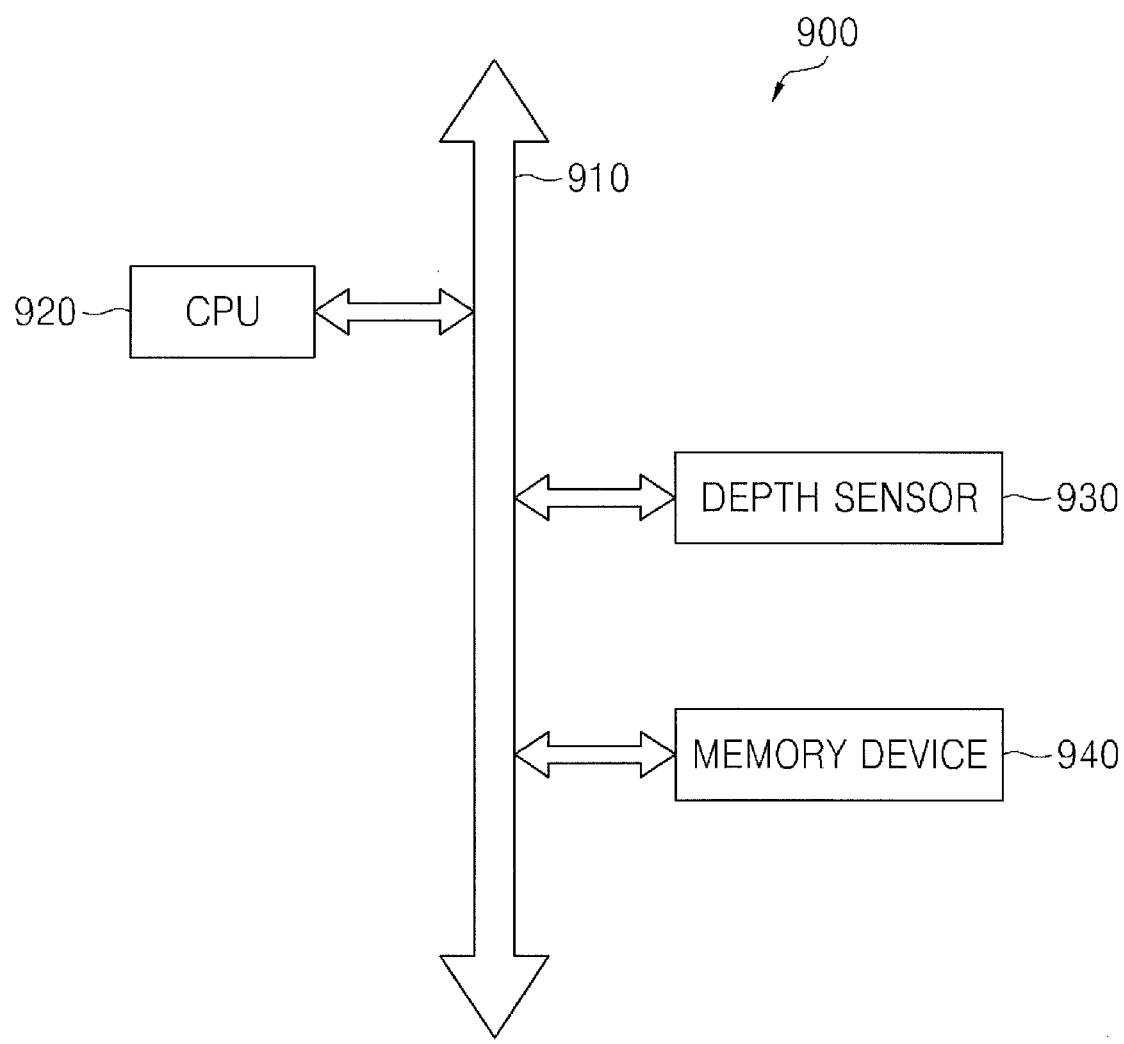
FIG. 10 is a block diagram of a semiconductor system 900 including the image sensor 100' according to some example embodiments of the inventive concepts.

FIG. 10 is a block diagram of a semiconductor system 900 including the image sensor 100' according to some example embodiments of the inventive concepts. The semiconductor system 900 may be implemented as a computer system, a mobile communication terminal, a camera system, a scanner, a navigation system, a videophone, a supervision system, an automatic focus system, a tracing system, an operation monitoring system, or an image stabilization system. However, the inventive concepts are not restricted to the current embodiments.

Referring FIG. 10, the semiconductor system 900 may include a bus 910, a central processing unit (CPU) 920, the depth sensor 930 including pixels according to some embodiments of the inventive concepts and a memory device 940.

The semiconductor system 900 may further include an interface (not shown) connected to the bus 910 for communicating with outside. For example, the interface may be an Input/Output interface or a wireless interface.

The CPU 920 may generate a control signal for controlling the operations of the depth sensor 930 and provide the control signal to the depth sensor 930 via the bus 910.

The memory device 940 may receive and store distance signals or three-dimensional (3D) image signals including the distance signals output from the depth sensor 940 via the bus 910.

The depth sensor 930 may be implemented as one chip with the CPU 920 and the memory device 940, as one chip with a digital signal processor, or as a separate chip. The depth sensor 930 may be implemented as the image sensor 100'.

The inventive concepts can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concepts can be easily construed by programmers.

As described above, in a pixel for a depth sensor according to an example embodiment of the inventive concepts, a first light-intensity extraction circuit and a second light-intensity extraction circuit may share a floating diffusion node, and a drain node or a floating diffusion node may be shared with a second pixel and third pixel adjacent to the pixel. Accordingly, a waste of space may be minimized resulting in manufacturing a relatively small-sized pixel, and the sensitivity of the depth sensor and the precision of distance calculation may be improved.

While the inventive concepts has been particularly shown and described with reference to example embodiments thereof, it will be understood that various changes in form and details may be made therein without departing from the spirit and scope of the following claims.

What is claimed is:

1. A unit pixel for a depth sensor, the unit pixel comprising:
   a light-intensity output circuit configured to output a pixel signal corresponding to a received first electric charge and a received second electric charge according to control signals;
   a first light-intensity extraction circuit configured to,
      generate the first electric charge,
      transmit the first electric charge to the light-intensity output circuit, and
      discharge the first electric charge via a first node electrically connected to the first light-intensity extraction circuit, the first electric charge varying according to an amount of light reflected from a target object; and
   a second light-intensity extraction circuit configured to,
      generate the second electric charge,
      transmit the second electric charge to the light-intensity output circuit, and
      discharge the second electric charge via a second node electrically connected to the second light-intensity extraction circuit, the second electric charge varying according to the amount of the reflected light, wherein
      the second node is electrically disconnected from the first node.

2. The unit pixel of claim 1, wherein the first light-intensity extraction circuit comprises:
   a first transmission transistor including a first end terminal connected to the light-intensity output circuit and configured to transmit the first electric charge to the light-intensity output circuit;
   a first drain transistor including a first end terminal connected to a second end terminal of the first transmission transistor; and
   a first photoelectric conversion device including a first end connected to the second end terminal of the first transmission transistor and the first end terminal of the first drain transistor, the first photoelectric conversion device configured to generate the first electric charge such that the first electric charge varies according to the amount of the reflected light.

3. The unit pixel of claim 1, wherein the first light-intensity extraction circuit comprises:
   a first transmission transistor including a first end terminal connected to the light-intensity output circuit;
   a first modulating block connected to a second end terminal of the first transmission transistor;
   a first drain transistor including a first end terminal connected to the first modulating block; and
   a first photoelectric conversion device connected to the first modulating block, the first photoelectric conversion device configured to generate the first electric charge such that the first electric charge varies according to the amount of the reflected light, wherein
      the first modulating block comprises at least one modulating transistor connected in series between the second end terminal of the first transmission transistor and the first end terminal of the first drain transistor,
      the at least one modulating transistor is configured to transmit the first electric charge to the first transmission transistor and the first drain transistor, and
      the first transmission transistor is configured to transmit the first electric charge to the light-intensity output circuit.

4. The unit pixel of claim 1, wherein the second light-intensity extraction circuit comprises:
   a second transmission transistor including a first end terminal connected to the light-intensity output circuit and configured to transmit the second electric charge to the light-intensity output circuit;
   a second drain transistor including a first end terminal connected to a second end terminal of the second transmission transistor; and
   a second photoelectric conversion device including a first end connected to the second end terminal of the second transmission transistor and the first end terminal of the second drain transistor, the second photoelectric conversion device configured to generate the second electric charge such that the second electric charge varies according to the amount of the reflected light.

5. The unit pixel of claim 1, wherein the second light-intensity extraction circuit comprises:
   a second transmission transistor including a first end terminal connected to the light-intensity output circuit;
   a second modulating block connected to a second end terminal of the second transmission transistor;
   a second drain transistor including a first end terminal connected to the second modulating block; and
   a second photoelectric conversion device connected to the second modulating block, the second photoelectric conversion device configured to generate the second electric charge such that the second electric charge varies according to the amount of the reflected light, wherein,
      the second modulating block includes at least one modulating transistor connected in series between the second end terminal of the second transmission transistor and the first end terminal of the second drain transistor,
      the at least one modulating transistor is configured to transmit the second electric charge to the second transmission transistor and the second drain transistor, and
      the second transmission transistor transmits the second electric charge to the light-intensity output circuit.

6. The unit pixel of claim 1, wherein the light-intensity output circuit comprises:
   a selection transistor;
   a reset transistor including a first end terminal connected to a first floating diffusion node, the reset transistor configured to discharge the first and second electric charges which are accumulated in the first floating diffusion node, according to a reset signal, the reset signal being one of the control signals; and a drive transistor including a gate terminal and a first end terminal, the gate terminal is connected to the first floating diffusion node and the first end terminal is connected to the selection transistor, the drive transistor is configured to transmit the pixel signal by buffering the first and second electric charges accumulated in the first floating diffusion node, wherein the selection transistor includes a first end terminal connected to the drive transistor, and the selection transistor is configured to transmit the pixel signal received from the drive transistor according to a selection signal, the selection signal being one of the control signals.

7. An image sensor comprising:
a pixel array including the unit pixel of the depth sensor of claim 1; and
a controller configured to control an operation of the pixel array.

8. A semiconductor system comprising the image sensor of claim 7.

9. A unit pixel for a depth sensor, the unit pixel comprising:
a light-intensity output circuit configured to output a pixel signal corresponding to a first electric charge and a second electric charge according to control signals;
a first light-intensity extraction circuit configured to,
  generate the first electric charge,
  transmit the first electric charge to the light-intensity output circuit, and
  discharge the first electric charge via a first node electrically connected to the first light-intensity extraction circuit, the first electric charge varying according to an amount of light reflected from a target object; and
a second light-intensity extraction circuit configured to,
  generate the second electric charge,
  transmit the second electric charge to the light-intensity output circuit, and
  discharge the second electric charge via a second node electrically connected to the second light-intensity extraction circuit, the second electric charge varying according to the amount of light reflected, wherein
a first photoelectric conversion device is shared by a third light-intensity extraction circuit, and the second photoelectric conversion device is shared by a fourth light-intensity extraction circuit, and
the second node is electrically disconnected from the first node.

10. The unit pixel of claim 9, wherein the unit pixel is a first pixel,
the third light-intensity extraction circuit is included in a second pixel adjacent to the first pixel, and
the fourth light-intensity extraction circuit is included in a third pixel adjacent to the first pixel.

11. The unit pixel of claim 9, wherein the first light-intensity extraction circuit comprises a first transmission transistor including a first end terminal connected to the light-intensity output circuit and configured to transmit the first electric charge to the light-intensity output circuit, and
the first photoelectric conversion device includes a first end terminal connected to a second end terminal of the first transmission transistor and a first end terminal of a third transmission transistor included in the third light-intensity extraction circuit.

12. The unit pixel of claim 9, wherein the first light-intensity extraction circuit comprises:

a first transmission transistor including a first end terminal connected to the light-intensity output circuit configured to transmit the first electric charge to the light-intensity output circuit; and
a first modulating block connected to a second end terminal of the first transmission transistor,
  wherein the first photoelectric conversion device is connected to the first modulating block,
  the first modulating block includes at least one modulating transistor connected in series between the second end terminal of the first transmission transistor and a first end terminal of a third transmission transistor included in the third light-intensity extraction circuit, and
  the at least one modulating transistor is configured to transmit the first electric charge to the first transmission transistor and the third transmission transistor.

13. The unit pixel of claim 9, wherein the second light-intensity extraction circuit further comprises a second transmission transistor, a first end terminal of which is connected to the light-intensity output circuit, the second transmission transistor for transmitting the second electric charge to the light-intensity output circuit, and
the second photoelectric conversion device has a first end terminal connected to a second end terminal of the second transmission transistor and a first end terminal of a fourth transmission terminal included in the fourth light-intensity extraction circuit.

14. The unit pixel of claim 9, wherein the second light-intensity extraction circuit comprises:
a second transmission transistor including a first end terminal connected to the light-intensity output circuit configured to transmit the second electric charge to the light-intensity output circuit; and
a second modulating block connected to a second end terminal of the second transmission transistor, wherein
  the second photoelectric conversion device is connected to the second modulating block,
  the second modulating block includes at least one modulating transistor connected in series between the second end terminal of the second transmission transistor and a first end terminal of a fourth transmission transistor included in the fourth light-intensity extraction circuit, and
  the at least one modulating transistor is configured to transmit the second electric charge to the second transmission transistor and the fourth transmission transistor.

15. The unit pixel of claim 9, wherein the light-intensity output circuit comprises:
a selection transistor;
a reset transistor including a first end terminal connected to a first floating diffusion node, the reset transistor configured to discharge the first and second electric charges accumulated in the first floating diffusion node, according to a reset signal that is one of the control signals; and
a drive transistor including a gate terminal and a first end terminal, the gate terminal is connected to the first floating diffusion node and the first end terminal is connected to the selection transistor, the drive transistor is configured to transmit the pixel signal by buffering the first and second electric charges accumulated in the first floating diffusion node, and
the selection transistor has a first end terminal connected to the drive transistor, and outputs the pixel signal received from the drive transistor according to a selection signal that is one of the control signals.

16. A unit pixel array comprising,
a depth pixel configured to sense an amount of a light reflected from a target object, the depth pixel including,
   a first light-intensity extraction circuit including a first photoelectric conversion device configured to generate a first electric charge corresponding to the amount of light reflected, the first light-intensity extraction unit configured to selectively provide the first electric charge to a floating diffusion node and discharge the first electric charge via a first node, the first node electrically connected to the first light-intensity extraction circuit,
   a second light-intensity extraction circuit including a second photoelectric conversion device configured to generate a second electric charge corresponding to the amount of light reflected, the second light-intensity extraction unit configured to selectively provide the second electric charge to the floating diffusion node and discharge the second electric charge via a second node, the second node electrically connected to the second light-intensity extraction circuit, and
   a light-intensity output circuit including the floating diffusion node, the light intensity output circuit configured to output a pixel signal that corresponds to the first electric charge and the second electric charge, if the light-intensity output circuit receives a select signal, wherein
   the second node is electrically disconnected from the first node.

17. The unit pixel array of claim 16, wherein
the light-intensity output circuit further includes,
   a selection transistor configured to selectively output the pixel signal according to the select signal, and
   a drive switch connected to the selection transistor, the drive switch configured to selectively provide the pixel signal to the selection transistor according to the first electric charge and the second electric charge provided to the first floating diffusion node;
the first light-intensity extraction unit further includes,
   a first transmission transistor configured to selectively provide the first electric charge to the floating diffusion node, and
   a first discharge transistor configured to selectively provide the first electric charge to the first node shared with a first adjacent depth pixel; and
the second light-intensity extraction unit further includes,
   a second transmission transistor configured to selectively provide the second electric charge to the floating diffusion node, and
   a second discharge transistor configured to selectively provide the second electric charge to the second node shared with a second adjacent depth pixel, the second node being electrically disconnected from the first node.

18. The unit pixel array of claim 16, wherein
the first light-intensity extraction unit further includes a first moduling block connected to the first photoelectric conversion device, the first moduling block configured to amplify the first electric charge and provide the amplified first electric charge to the floating diffusion node, and
the second light-intensity extraction unit further includes a second moduling block connected to the second photoelectric conversion device, the second moduling block configured to amplify the second electric charge and provide the amplified second electric charge to the floating diffusion node.

19. The unit pixel array of claim 16, further comprising a plurality of color pixels configured to sense a color of the target object.

20. A depth sensor comprising:
   a pixel array including a plurality of unit pixel arrays of claim 16, each of the unit pixel arrays configured to output a pixel signal; and
   a signal processor configured to calculate a time difference between a time when a pulse of light is projected toward the target object and a time when the signal processor receives the pixel signal indicating that the reflected light is sensed by the depth pixel.

* * * * *